(12) United States Patent
Yamaguchi et al.

(10) Patent No.: US 8,778,815 B2
(45) Date of Patent: Jul. 15, 2014

(54) FILM FORMING METHOD

(71) Applicant: Tokyo Electron Limited, Tokyo (JP)

(72) Inventors: Tatsuya Yamaguchi, Nirasaki (JP);
Reiji Niino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/901,889

(22) Filed: May 24, 2013

(65) Prior Publication Data
US 2013/0316545 A1    Nov. 28, 2013

(30) Foreign Application Priority Data

May 28, 2012 (JP) ................................ 2012-121060

(51) Int. Cl.
*H01L 21/469* (2006.01)
(52) U.S. Cl.
USPC ............................ 438/781; 428/500; 528/179
(58) Field of Classification Search
CPC ..................... H01L 21/02118; H01L 21/0228; H01L 31/1876; H05K 3/387
See application file for complete search history.

(56) References Cited

U.S. PATENT DOCUMENTS

| | | | |
|---|---|---|---|
| 2006/0199920 A1* | 9/2006 | Okada et al. .................. 525/426 |
| 2011/0091650 A1* | 4/2011 | Noguchi et al. ......... 427/255.28 |
| 2013/0316080 A1* | 11/2013 | Yamaguchi et al. ....... 427/255.6 |

FOREIGN PATENT DOCUMENTS

JP        8-176803 A    7/1996

* cited by examiner

*Primary Examiner* — Zandra Smith
*Assistant Examiner* — Pamela E Perkins
(74) *Attorney, Agent, or Firm* — Nath Goldberg & Meyer; Jerald L. Meyer

(57) ABSTRACT

A method of forming a polyimide film on a surface of a substrate by dehydration condensation of a first monomer including a bifunctional acid anhydride and a second monomer including a bifunctional amine is disclosed. The method includes loading the substrate into a processing chamber, heating the substrate at a temperature at which a polyimide film is formed, and performing a cycle a predetermined number of times. The cycle comprises supplying a first processing gas containing the first monomer to the substrate, supplying a second processing gas containing the second monomer to the substrate. The method further includes supplying a replacement gas in the processing chamber between supplying the first processing gas and supplying the second processing gas thereby replacing atmosphere in the processing chamber by the replacement gas, and evacuating the first and/or the second processing gas out of the processing chamber.

4 Claims, 22 Drawing Sheets

First Monomer

FIG. 18

Second Monomer

| Abbreviation (Name) | Structural Formula | |
|---|---|---|
| 4-4'-ODA ($C_{10}H_{12}N_2O$ : 4-4'- diaminodiphenyl ether) | $2HN$—⬡—$O$—⬡—$NH_2$ | Aromatic Monomer |
| 3-4'-ODA ($C_{10}H_{12}N_2O$ : 3-4'- diaminodiphenyl ether) | $2HN$—⬡—$O$—⬡($NH_2$) | |
| NDA | $2HN$—naphthalene—$NH_2$ | |
| DDS | $2HN$—⬡—$SO_2$—⬡—$NH_2$ | |
| H12MDA | $2HN$—⬡—$CH_2$—⬡—$NH_2$ | Non-aromatic Monomer |
| H12MDAMe | $2HN$—⬡($CH_3$)—$CH_2$—⬡($CH_3$)—$NH_2$ | |
| H6XDA | cyclohexane with $CH_2NH_2$ groups | |
| HMDA ($C_{10}H_{12}N_2$ : hexamethylenediamine) | $2HN$〜〜〜$NH_2$ | |
| DAD | $2HN$〜〜〜〜$NH_2$ | |

FILM FORMING METHOD

CROSS-REFERENCE TO RELATED APPLICATION

This application claims the benefit of Japanese Patent Application No. 2012-121060, filed on May 28, 2012, in the Japan Patent Office, the disclosure of which is incorporated herein in its entirety by reference.

TECHNICAL FIELD

The present disclosure relates to a method for forming a polyimide film on a substrate.

BACKGROUND

A polyimide film is known as one of organic-based thin films used to manufacture a semiconductor device. The polyimide film is formed, for example, by dehydration condensation of two kinds of monomers. Specifically, as illustrated later in FIG. 2, a bifunctional acid anhydride, e.g., PMDA ($C_{10}H_2O_6$: pyromellitic dianhydride), and a bifunctional amine, e.g., HMDA ($C_6H_{16}N_2$: hexamethylenediamine) are used as the monomers. A polyimide film is formed by mixing the monomers in a solution to produce a polyamide acid solution that is a precursor solution and then by applying the precursor solution to a substrate such as a semiconductor wafer (hereinafter, referred to as a "wafer") and simultaneously heating the wafer.

However, in integration of semiconductor devices electronic devices such as a cellular phone and the like. As such, the configuration has been suggested to stack a plurality of wafers each having such semiconductor devices formed thereon, and simultaneously, electrode portions of the respective devices are vertically connected to each other. The inventors have considered the following aspect in forming such three-dimensional configuration.

That is, for example, a hole-shaped concave portion is formed in such a manner that a device is formed on a surface of a wafer and dry etching is performed from the back side of the wafer so that an electrode portion on the underside of the device is exposed. Then, a conducting portion such as copper is buried in the concave portion. Simultaneously, disposing another wafer having a device formed thereon on the back side of the wafer, so that both the devices are electrically connected to each other through the conducting portion (specifically, including a bump and the like disposed between the wafers). Accordingly, a plurality of the wafers is sequentially stacked, thereby forming the integration structure of devices. Practically, although a process of forming the concave portion or a process of burying the conducting portion is performed while turning the wafer over, the surface of the wafer is here described as a side having the device formed thereon for convenience of illustration.

The aforementioned concave portion is formed to have a depth (e.g., 50 micrometers) until the device is reached from the back side of the wafer. Meanwhile, the concave portion is formed to have an opening dimension (diameter), e.g., a small diameter of 5 micrometers, so as not to interfere with a conducting portion of another integrated structure adjacent to the concave portion, i.e., so as to highly density the integrated structure as much as possible. Therefore, the concave portion has an extremely large aspect ratio (i.e., the ratio of the diameter to the depth of the opening).

In this case, since the wafer is made of silicon (Si), an insulation film is necessarily formed along an inner wall of the concave portion before the conducting portion is buried therein so that the wafer and the conducting portion are not electrically connected to each other through the inner wall of the concave portion (so that the wafer and the conducting portion are insulated from each other). Thus, the inventors attempt to apply the polyimide film as the insulation film. FIG. 12 shows the configuration described above, wherein reference numeral 1 designates a polyimide film, reference numeral 10 designates a concave portion, reference numeral 11 designates a device, reference numeral 14 designates a temporary fixing material, and reference numeral 15 designates a support substrate.

However, in the polymerization of the monomer, a large thermal energy of 30 kJ/mol or more is required to move monomer molecules. Specifically, the heating temperature of the wafer is set, for example, to 300 degrees C. or more. Therefore, such heating causes the dehydration condensation of the monomers on the wafer along the thickness direction of the polyimide film. Hence, the entire volume of the polyimide film is rapidly decreased, and thus, a large stress occurs in the wafer. Also, if a precursor solution is used, the precursor solution is buried in the concave portion, and therefore, the conducting portion cannot be formed. In order to obtain a high polymerization degree for the polyimide film (in order to increase the number of straight chains of imide molecules in the polyimide film), the mixture ratio of the respective monomers necessarily corresponds to 1:1. Therefore, since the concentration of each monomer should be strictly controlled, the configuration or control of an apparatus for forming the polyimide layer becomes complicated, and the kind (a combination) of available monomers is limited. In addition, the thickness of the polyimide film is changed depending on the concentration of the precursor (the concentration of each monomer) or the mixture ratio in the surface of the wafer.

Meanwhile, a method for forming a polyimide film of which the c-axis is oriented in the vertical direction with respect to a substrate by alternately depositing two kinds of monomers on a surface of the substrate is suggested. In this method, the temperature of the surface of the substrate is set to 45 to 50 degrees C., and the substrate is then heated to 300 degrees C. immediately after stopping the deposition of the monomers. However, according to the method, the concave portion as described above cannot be satisfactorily buried, and it is necessary to elevate the process temperature of the latter stage in which there is a high difference in temperature during a film forming process.

SUMMARY

The present disclosure is to provide a method of forming a polyimide film on a substrate, which can be easily controlled and form a high-quality polyimide film.

According to an aspect of the present disclosure, a method of forming a polyimide film on a surface of a substrate by dehydration condensation of a first monomer including a bifunctional acid anhydride and a second monomer including a bifunctional amine is disclosed. The method includes loading the substrate into a processing chamber, heating the substrate at a temperature at which a polyimide film is formed, and performing a cycle a predetermined number of times. The cycle comprises supplying a first processing gas containing the first monomer to the substrate, supplying a second processing gas containing the second monomer to the substrate. The method further includes supplying a replacement gas in the processing chamber between supplying the first processing gas and supplying the second processing gas thereby replacing atmosphere in the processing chamber by the replacement gas, and evacuating the first and/or the second processing gas out of the processing chamber.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 18 is an explanatory view showing an example of a second monomer used in the film forming method.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<First Embodiment>

Figure 1:
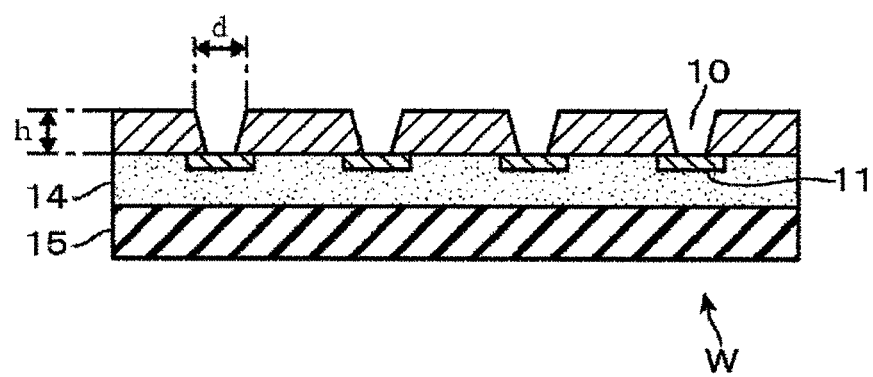
FIG. 1 is a longitudinal sectional view schematically showing an example of a surface structure of a wafer of the present disclosure.

A first embodiment according to a film forming method of the present disclosure will be described with reference to FIGS. 1 to 13. FIG. 1 shows a surface structure of a wafer W, which is a substrate to be treated and will be subjected to film forming processing. In this embodiment, reference numeral 10 designates a concave portion in the form of a hole, reference numeral 11 designates a device formed on an underside of the wafer W, reference numeral 14 designates a temporary fixing material, such as a resin or the like, and reference numeral 15 designates a support substrate. The concave portion 10 is formed to have an opening dimension d of 1 micrometer to few tens of micrometers and a depth h of 10 micrometers to few hundreds of micrometers. Therefore, the aspect ratio (h/d) of the concave portion 10 is, for example, about 5 to 20. The aspect ratio of the concave portion 10 is shown small in FIG. 1. In the film forming method of the present disclosure, a polyimide film 1, which will be described later, is formed on a surface structure shown in FIG. 1 and then subjected to predetermined processes, thereby obtaining a structure shown in FIG. 13. FIG. 13 shows a portion of a target semiconductor device. In FIG. 13, reference numeral W1 designates a wafer other than the wafer W, reference numeral 13 designates a conducting portion, and reference numeral 16 designates a bump. The polyimide film 1 functions as a barrier film for preventing metal components of the conducting portion 13 from being diffused into the wafer W.

<Synthetic Mechanism of Polyimide Film>

Figure 2:
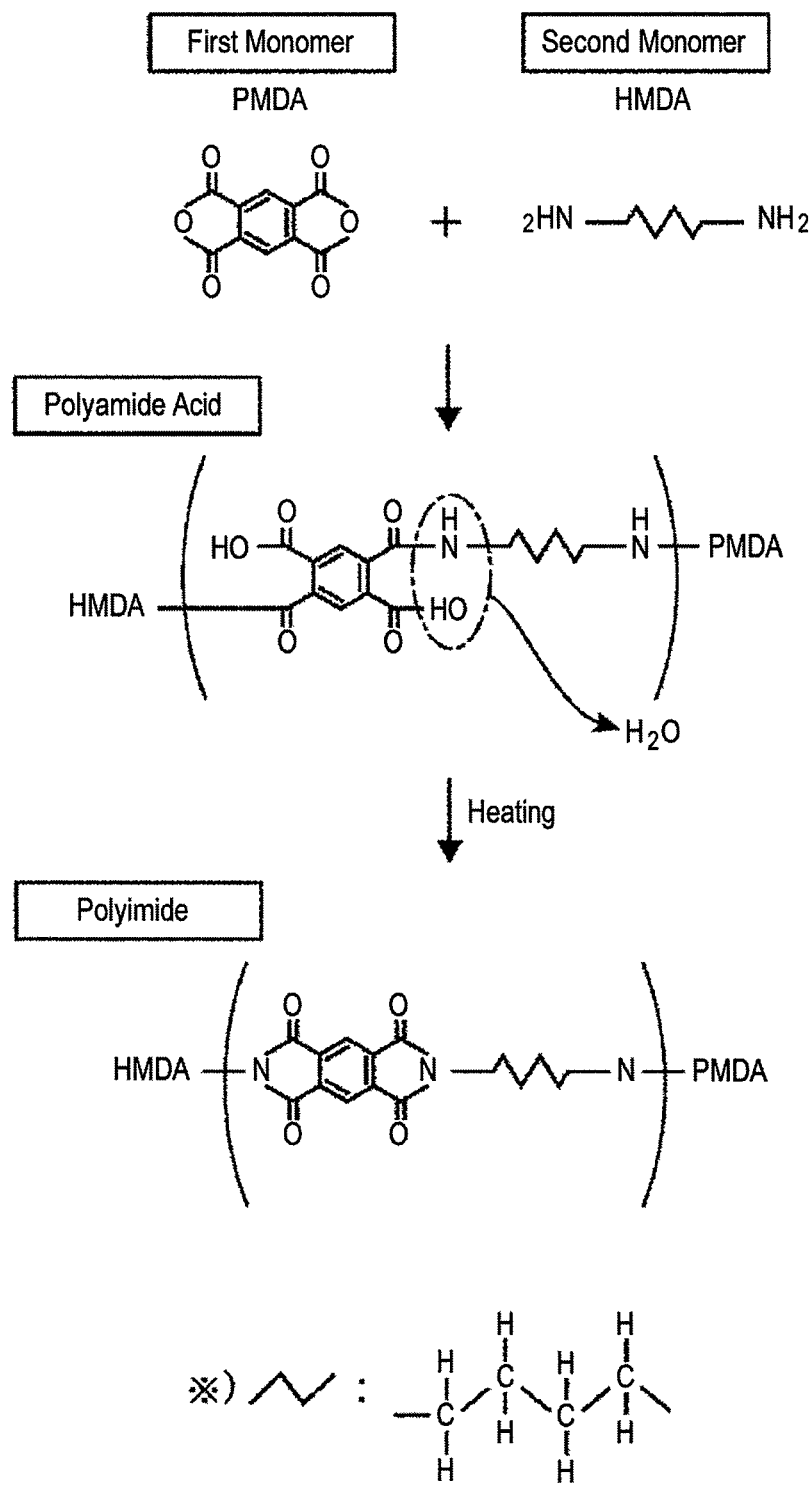
FIG. 2 is a schematic view illustrating a process of forming a polyimide film.

According to the first embodiment of the present disclosure, a method of forming the polyimide film 1 on the surface of the structure is shown in FIG 1. First, a mechanism for synthesizing the polyimide film 1 will be described. As shown in the top of FIG. 2, a first monomer including a bifunctional acid anhydride, e.g., PMDA, and a second monomer including a bifunctional amine, e.g., HMDA ($C_6H_{16}N_2$: hexamethylenediamine), are used in synthesizing the polyimide film 1. Specifically, PMDA has two functional groups, each of which includes a 5-membered ring, in which four carbon elements (C) and one oxygen element (O) are linked to one another in a ring shape by a single bond, and other two oxygen elements are linked to the respective carbon elements adjacent to the oxygen element by a double bond. The respective oxygen elements in each 5-membered ring are disposed toward the outside, and benzene sharing two carbon elements in each functional group is interposed between the two functional groups, thereby forming an aromatic monomer. The 5-membered ring is used to form an imide ring.

In HMDA, two amino groups (—NH$_2$), each of which has one nitrogen element (N) and two hydrogen elements (H), are disposed, and the nitrogen elements are respectively bonded to one end and the other end of an alkane, in which a plurality of carbon elements, i.e., six carbon elements in this embodiment, are arranged in a straight chain shape by a single bond. Accordingly, HMDA becomes aliphatic amine that is a non-aromatic monomer. In FIG. 2, carbon and hydrogen elements are omitted.

In addition, if the two kinds of monomers are mixed with each other, a polyamide acid that is a precursor shown in the middle of FIG. 2 is produced. Therefore, the dehydration condensation occurs by means of heat treatment (heating) of the precursor, and a polyimide shown in the bottom of FIG. 2 is synthesized.

<Reaction in Solution or Reaction Using Mixture Gas of Two Monomers>

Here, when the polyimide film 1 is formed in such a manner that the aforementioned precursor is formed, for example, in a solution, the precursor solution is applied to a surface of the wafer W and then a heat treatment is performed. In this case, since the precursor is buried in the concave portion 10, the conducting portion 13 cannot be formed in subsequent processes. Meanwhile, if the polyimide film 1 is formed on the wafer W through the precursor by supplying the wafer W with a mixture gas obtained by mixing the first and second monomers in the form of gas, the thickness of polyimide film 1 varies in the surface of the wafer W.

Figure 3:
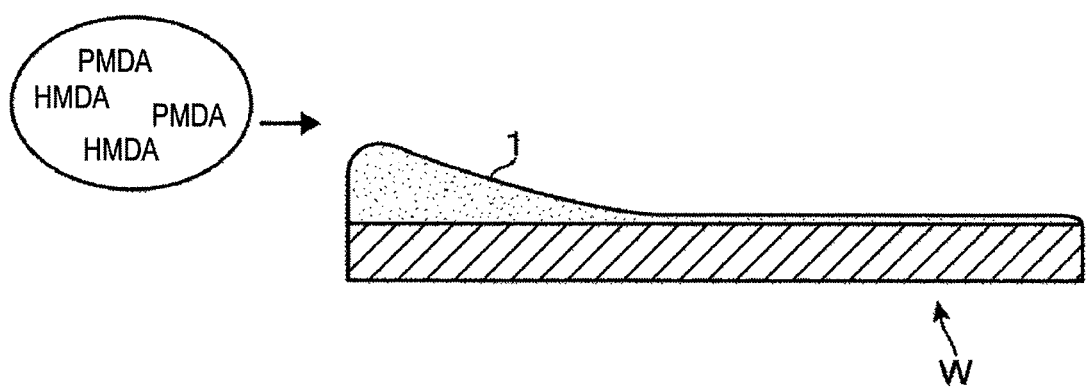
FIG. 3 is a longitudinal sectional view schematically showing a polyimide film formed when monomers are mixed.

That is, since the reaction between the monomers occurs extremely easily, the polyimide film 1 is rapidly formed from a contact portion between the wafer W and the mixture gas. Therefore, for example, when a side flow method, which will be described later, is employed, the monomers are gradually consumed from the upstream side toward the downstream side of the gas flow as shown in FIG. 3, and the thickness of the polyimide film 1 varies in the surface of the wafer W. Also, the film forming rate of the polyimide film 1 varies depending on the processing temperature (the film forming temperature) of the wafer W. In other words, when the polyimide film 1 is formed using the mixture gas, it is necessary to strictly control the heating temperature of the wafer W. Although the temperature of the wafer W is controlled as described above, it is extremely difficult to obtain the preferred uniformity in the thickness of the polyimide film 1. Even when the mixture gas is supplied to a central portion of the wafer W and then radially diffused toward a circumferential portion thereof, the thickness of the polyimide film 1 also varies in the central portion and the circumferential portion.

When the mixture gas of the monomers is used, in order to obtain a high polymerization degree for the polyimide film 1 as described in the background section, it is necessary for the amounts of the respective monomers adsorbed onto the wafer W to correspond to each other and also for the vapor pressures (the concentrations) or mixture proportions of the monomers to correspond to each other. Therefore, the configuration or control of the apparatus is complicated, or the kinds of available monomers are limited.

<Film Forming Method of First Embodiment>

In this context, the first embodiment employs a method described below. In this embodiment, it is possible to form the polyimide film 1 having an excellent uniformity in the film thickness (excellent burial characteristics into the concave portion 10) and a high polymerization degree without strictly controlling the supply amount or the method of each monomer, or the heating temperature of the wafer W. Further, it does not matter which kind (the vapor pressure) of each monomer is used. The configuration of a vertical type heat treatment apparatus used in the film forming method will be described with reference to FIGS. 4 and 5.

<Film Forming Apparatus>

Figure 4:
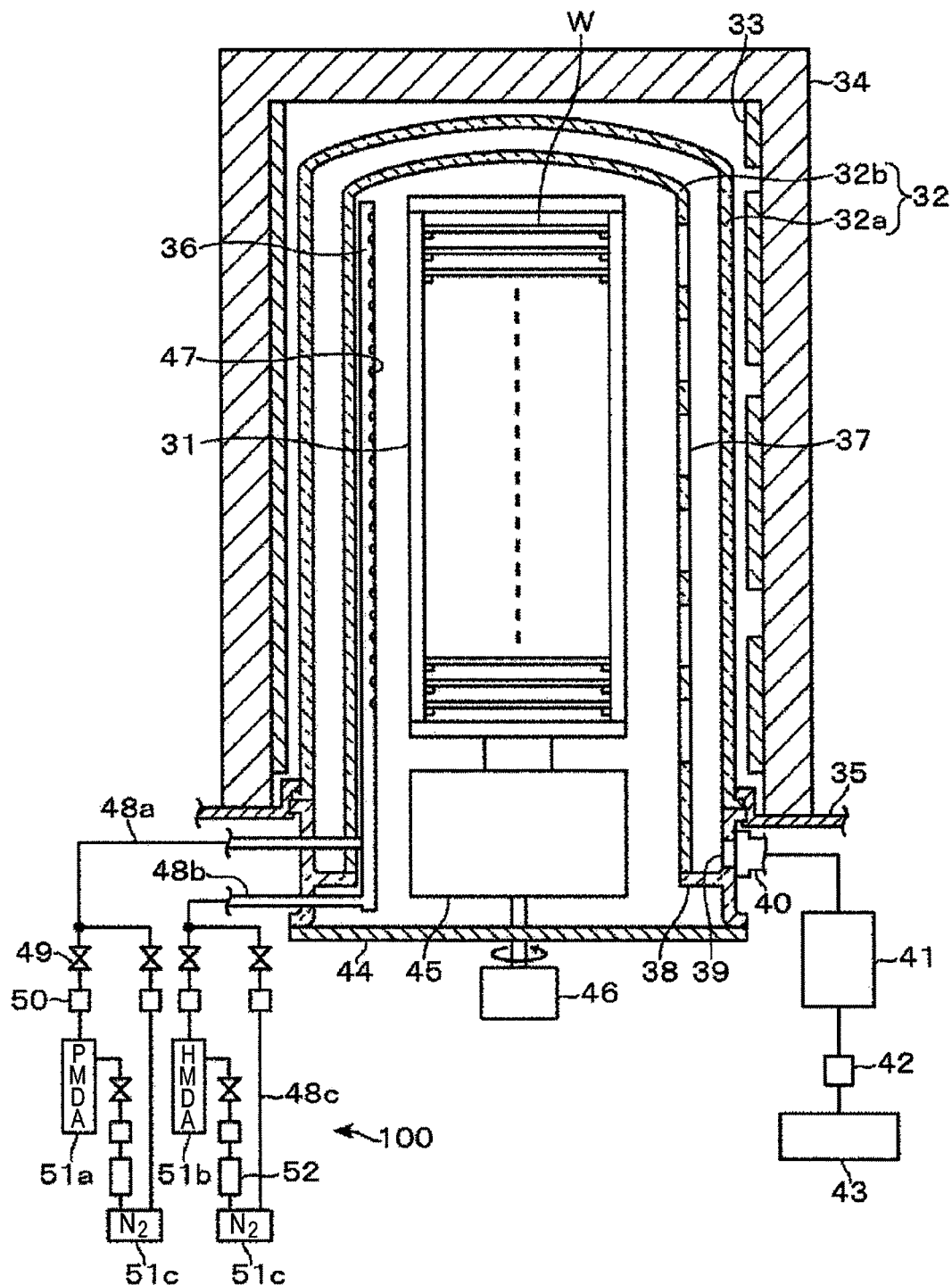
FIG. 4 is a longitudinal sectional view showing an example of an apparatus for performing a film forming method.

The vertical type heat treatment apparatus, as shown in FIG. 4, has a wafer boat 31 for loading wafers W in a shelf form, a reaction tube (processing chamber) 32 for accommodating the wafer boat 31 therein and performing film forming processing on each wafer W. A heating furnace main body 34 having a heater 33 disposed on an inner wall thereof is mounted outside the reaction tube 32. In FIG. 4, reference numeral 35 designates a support portion for supporting the reaction tube 32 and the heating furnace main body 34 from a lower side.

The reaction tube 32, in this example, has a double tube structure of an outer tube 32a and an inner tube 32b accommodated inside the outer tube 32a, and a gas injector 36 formed to extend along the lengthwise direction of the inner tube 32b is accommodated inside the inner tube 32b. A plurality of slit-shaped openings 37 extending in the lengthwise direction of the inner tube 32b are vertically formed in a lateral side of the inner tube 32b so as to face the gas injector 36. In FIG. 4, reference numeral 38 designates a substantially cylindrical flange portion configured to support the outer and inner tubes 32a and 32b from the lower side and to air-tightly seal the region between the lower end surfaces of the outer and inner tubes 32a and 32b.

An exhaust opening 39 is formed in a sidewall of the flange portion 38 so as to communicate with the region between the outer and inner tubes 32a and 32b, and a vacuum pump 43 is connected to an evacuation path 40, which extends from the exhaust opening 39, through a removing device 41, which is a trap for removing solid materials or the like produced in the reaction tube 32, and a pressure control unit 42, such as a butterfly valve. In FIG. 4, reference numerals 44 and 45 respectively designate a cover, which air-tightly seals an opening end of the inner tube 32b, and a heat insulator. In FIG. 4, reference numeral 46 designates a rotating mechanism such as a motor for rotating the wafer boat 31 and heat insulator 45 about the vertical axis.

Figure 5:
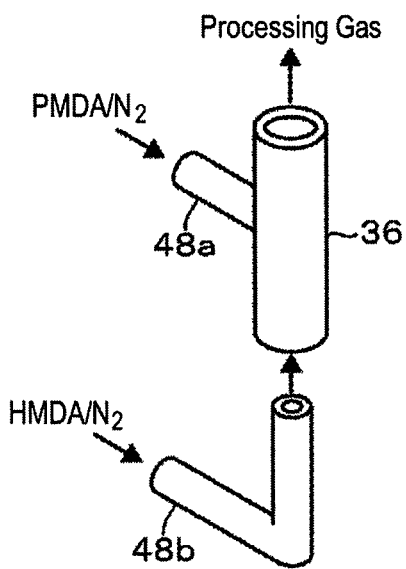
FIG. 5 is an enlarged perspective view showing a portion of a gas injector in the apparatus.

A plurality of gas injection holes 47 are formed along the vertical direction in the sidewall of the gas injector 36 so as to correspond to the levels of the respective wafers W accommodated in the wafer boat 31, i.e., to supply gas to the respective wafers W using a side flow method, which will be described later. Gas supply pipes 48a and 48b for respectively supplying first and second processing gases into the gas injector 36 are air-tightly connected to a lower side of the gas injector 36. Specifically, as shown in FIG. 5, a lower end of the gas injector 36 is open, and one end of the gas supply pipe 48b for supplying the second processing gas is air-tightly inserted into the open end. One end of the gas supply pipe 48a for supplying the first processing gas is connected to a lateral side of the gas injector 36, which is positioned slightly above the open end. Accordingly, these processing gases are independently supplied into the gas injector 36.

The other ends of the gas supply pipes 48a and 48b air-tightly penetrate the sidewall of the flange portion 38 and are respectively connected to gas storage sources 51a and 51b, which respectively store the first and second monomers, through valves 49 and flow rate control units 50. In FIG. 4, reference numeral 51c designates gas storage sources in which, for example, nitrogen (N$_2$) gas is stored. The gas storage sources 51*c* are connected to the gas supply pipes 48*a* and 48*b* through gas supply pipes 48*c*, respectively. Simultaneously, the gas storage sources 51*c* are respectively connected to the gas storage sources 51*a* and 51*b* through the gas supply pipes 48*c* each having a heater 52 mounted thereto so as to use the nitrogen gas as carrier gas of each monomer. The valves 49, the flow rate control units 50, and the gas storage sources 51*a*, 51*b* and 51*c* constitute a gas supply system 100. Practically, each of the gas storage sources 51*a* and 51*b* is configured to gasify (evaporate) a monomer by supplying a heated nitrogen gas into an accommodation container (not shown) in which a solid (particle) or liquid monomer is accommodated, but the term "gas storage source" is used herein.

The vertical type heat treatment apparatus is provided with a control unit (not shown) having a computer for controlling the entire operations of the apparatus, and a memory of the controller stores a program (not shown) for performing the film forming processing by supplying processing and replacement gases into the reaction tube 32. The program is installed in the controller from a storage unit, i.e., a storage medium, such as a hard disk, a compact disk, a magneto-optical disk, a memory card or a flexible disk.

Hereinafter, the film forming method of the polyimide film 1 will be described together with the operation of the apparatus. First, the reactive tube 32 is air-tightly closed with the cover 44 after loading the wafer boat 31 having a plurality of wafers W accommodated therein into the reaction tube 32 that is heated, for example at 100 degrees C. to 250 degrees C., preferably 150 degrees C. to 200 degrees C. which is the temperature that polyimide film 1 is formed by the heater 33. Then, the pressure of the gas in the reaction tube 32 is set, through the pressure control unit 42, to a pressure at which the polyimide film 1 is preferably buried in the concave portion 10, e.g., a vacuum degree of 13 Pa (0.1 torr) to 267 Pa (2.0 torr), preferably 26 Pa (0.2 torr) to 133 Pa (1.0 torr). Simultaneously, the wafer boat 31 is rotated about the vertical axis.

Figure 6:
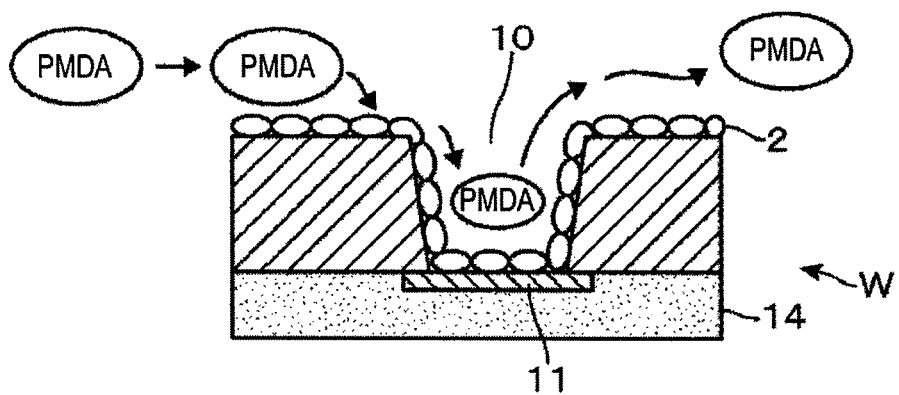
FIG. 6 is a longitudinal sectional view schematically illustrating a portion of the film forming method.

Then, as shown in FIG. 6, each wafer W is supplied with the first processing gas containing the first monomer from the gas injector 36 for a time duration t1 (e.g., 2 seconds), for example, using a side flow method. The first monomer flows from one side toward another side along the surface of the wafer W to be physically adsorbed onto the surface of the wafer W. Then, if the first monomer is adsorbed onto the surface of the wafer W, a portion of the first monomer over the first monomer is hardly or never adsorbed thereto, as can be seen in the following examples. Therefore, an adsorption layer 2 of a single layer (single molecular layer) is uniformly formed on the exposed side (surface) of the wafer W. Thus, a surplus of the first monomer supplied into the reaction tube 32 is discharged from the reaction tube 32. In this case, since the pressure in the reaction tube 32 is set in the aforementioned range, the adsorption layer 2 having high coatability is formed on an inner wall surface and a bottom surface of the concave portion 10 although the aspect ratio of the concave portion 10 is large.

Figure 7:
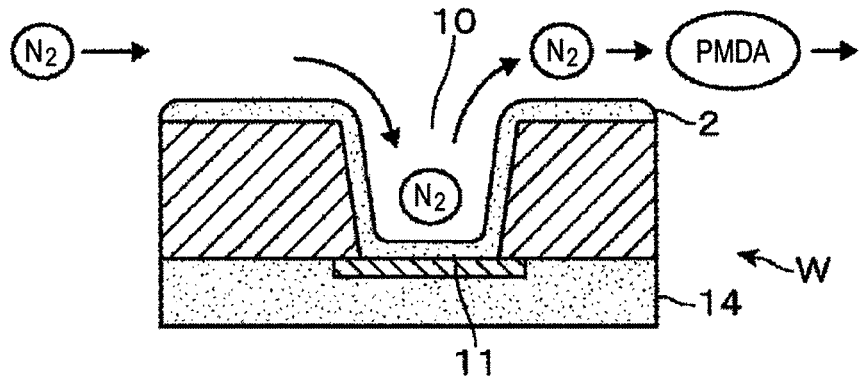
FIG. 7 is a longitudinal sectional view schematically illustrating a portion of the film forming method.

Then, the supply of the first processing gas is stopped, and simultaneously, an inert gas, e.g., a nitrogen gas or the like is supplied as a purge gas (replacement gas) into the reaction tube 32 for a time duration tp, e.g., 1 second or more (about 1 second to 10 seconds). As shown in FIG. 7, the surplus first processing gas remaining in the reaction tube 32 is discharged from the reaction tube 32 by the replacement gas, so that the atmosphere in the reaction tube 32 is replaced by the purge gas.

Figure 8:
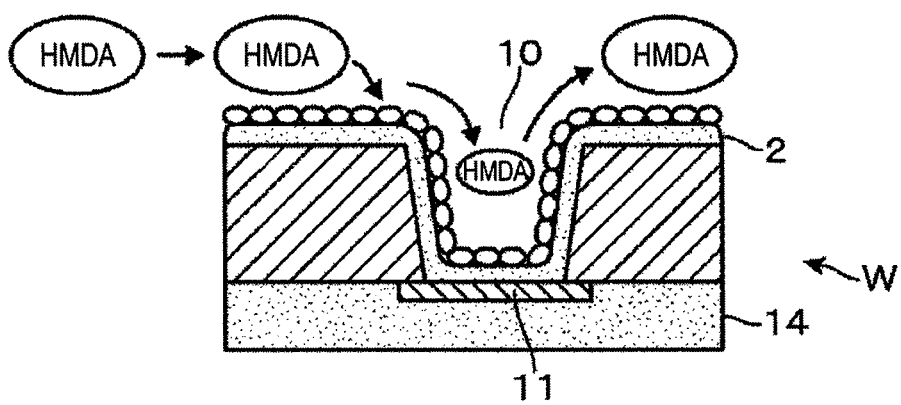
FIG. 8 is a longitudinal sectional view schematically illustrating a portion of the film forming method.

Subsequently, as shown in FIG. 8, the second processing gas containing the second monomer is supplied to the wafer W having the adsorption layer 2 formed thereon for a time duration t2, e.g., about 2 seconds, for example, using the side flow method. In this case, since the atmosphere in the reaction tube 32 has been replaced by the replacement gas, the second monomer is prevented from coming into contact with the first monomer which is spaced apart from the surface of the wafer W in the reaction tube 32 and staying therein.

The second monomer comes into contact with the adsorption layer 2 on the wafer W while flowing from one side toward another side of the wafer W. Since the wafer W is set to the forming temperature of the polyimide film 1, if the adsorption layer 2 and the second monomer come into contact with each other, the aforementioned precursor shown in FIG. 2 are rapidly produced, and simultaneously, the moisture (H$_2$O) immediately escapes from the precursor to allow the dehydration condensation to proceed, thereby forming a reactive layer 3 of polyimide having a plurality of imide molecules polymerized. Accordingly, since the so-called reactive layer 3 is formed from the adsorption layer 2 in such a manner, the reactive layer 3 is formed throughout the exposed surface of the wafer W including the inner wall surface or bottom surface of the concave portion 10.

In this case, since the reaction between the first and second monomers immediately occurs, the functional group including the 5-membered ring, which reacts with the second monomer, hardly or never remains in the reactive layer 3 formed on the surface of the wafer W. As can be seen in the following examples, the second monomer is not physically adsorbed (has difficulty in being adsorbed) onto the surface of the reactive layer 3. Therefore, since the reactive layer 3 is formed from the first monomer contained in the adsorption layer 2 and the second monomer in an amount capable of reacting with the first monomer, the proportions of the respective monomers is equalized. Accordingly, the reactive layer 3 is formed to have an extremely high polymerization degree. In other words, the functional group including the 5-membered ring contained in the adsorption layer 2 reacts with the second monomer without an excess or deficiency, so that the exposed surface of the wafer W is coated with the reactive layer 3 of a single layer. Similarly, a surplus of the second monomer supplied into the reaction tube 32 is also discharged from the reactive tube 32.

Figure 9:
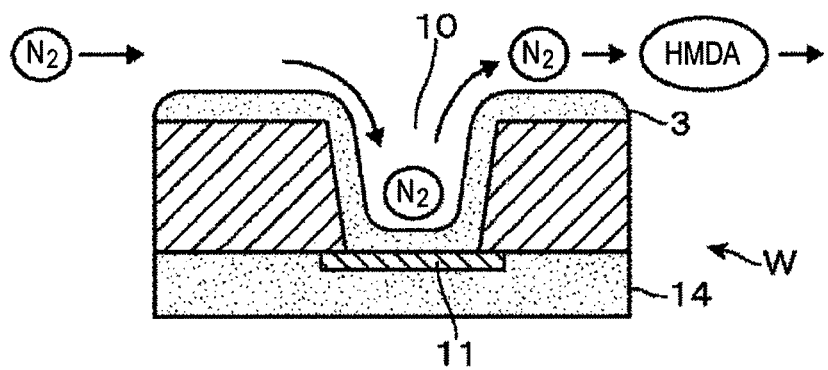
FIG. 9 is a longitudinal sectional view schematically illustrating a portion of the film forming method.

Then, the supply of the second processing gas is stopped, and simultaneously, a replacement gas is supplied into the reaction tube 32 for a time duration tp. As shown in FIG. 9, the replacement gas causes the second monomer in the reaction tube 32 to be discharged, so that the atmosphere in the reaction tube 32 is replaced by the replacement gas. When the heating temperature of the wafer W when the reactive layer 3 is formed is relatively low, for example, at 150 degrees C. or so, the precursor may remain in a portion of the reactive layer 3 at the time when the supply of the second processing gas is stopped. However, while the replacement gas is supplied into the reaction tube 32 to discharge the second monomer, the reaction of the precursor is performed to finish the production of the polyimide. Thus, the process of supplying the second processing gas and then replacing the atmosphere in the reaction tube 32 may be referred to as a process of discharging the second monomer from the reaction tube 32 and simultaneously finishing the production of the polyimide.

Figure 10:
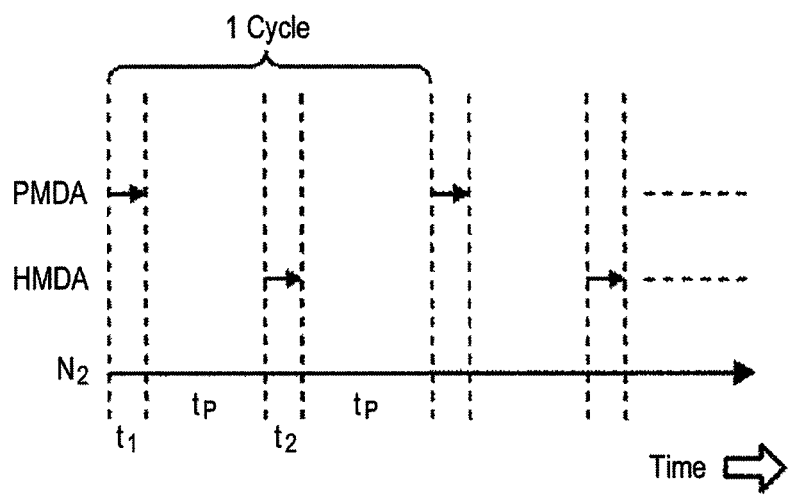
FIG. 10 is a schematic view illustrating an example of the film forming method.
Figure 11:
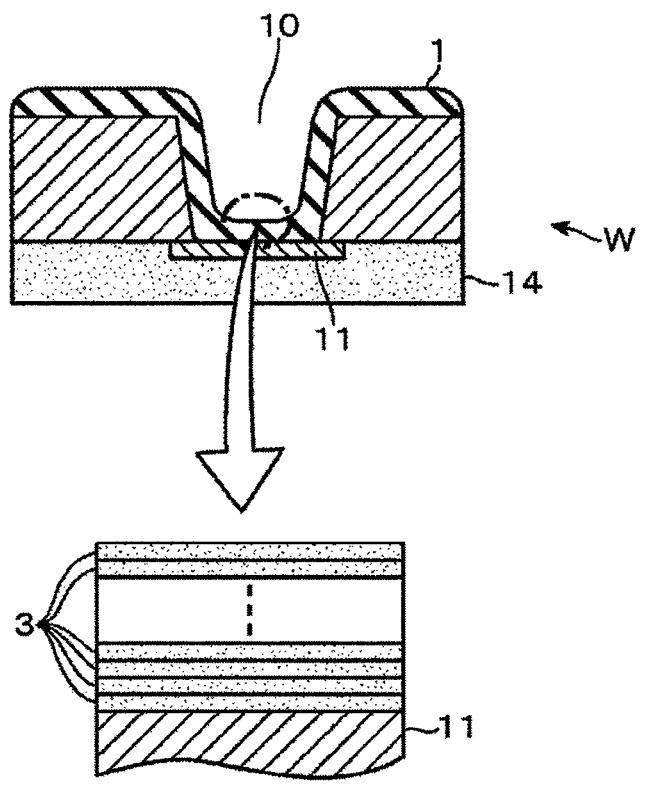
FIG. 11 is a longitudinal sectional view schematically showing the polyimide film.

Accordingly, if the cycle, in which as shown in FIG. 10, the process of supplying the first processing gas and the process of supplying the second processing gas are alternately performed while the process of replacing the atmosphere when switching the processing gases is performed, is repeated for a predetermined number of times (i.e., n times: n is an integer of 2 or more), e.g., 100 times or so, a plurality of the reactive layers 3 (the n reactive layers 3) are laminated to thereby form the aforementioned polyimide film 1, as shown in FIG. 11. The thickness of the polyimide film 1 depends on the number of the cycles, and specifically, is about 100 nm to 400 nm. Also, in FIG. 10, since the nitrogen gas is used not only as a replacement gas for replacing the atmosphere but also as a carrier gas for supplying each monomer into the reaction tube 32, the nitrogen gas is supplied from when the formation of the polyimide film 1 is started to when the formation of the polyimide film 1 is finished.

Figure 12:
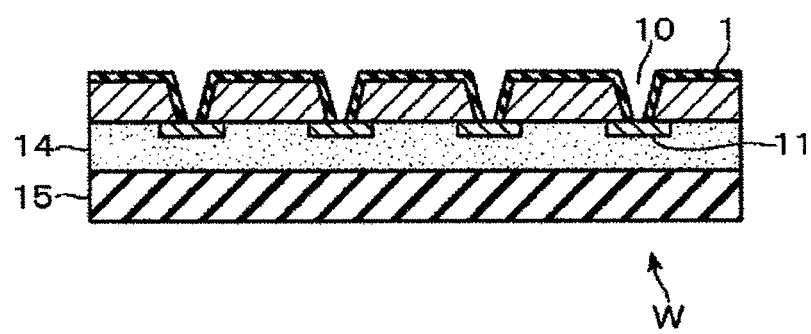
FIG. 12 is a longitudinal sectional view schematically illustrating a portion of the film forming method.
Figure 13:
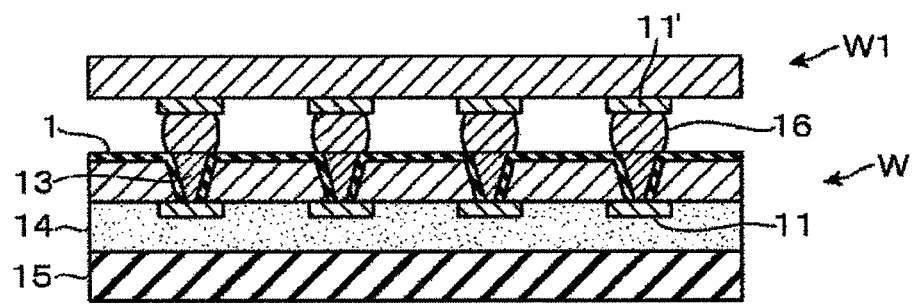
FIG. 13 is a longitudinal sectional view schematically illustrating a portion of the film forming method.

Then, as shown in FIG. 12, the bottom surface (the electrode portion of the device 11) of the concave portion 10 is exposed by photolithography, and then, the conducting portion 13, for example, of copper or the like, is buried in the concave portion 10 and chemical mechanical polishing (CMP) is performed. Similarly, as shown in FIG. 13, another wafer W1 having a device 11' formed thereon is disposed above the wafer W, and the upper and lower devices 11' and 11 are fixed and electrically connected to each other through the bumps 16, thereby obtaining the structure described above. Then, the temporary fixing material 14 is exfoliated by heating the structure, for example, at about 220 degrees C., so that the support substrate 15 is removed from the structure.

According to the embodiment described above, the polyimide film 1 is formed by the sequence polymerization method, in which the first monomer including a bifunctional acid anhydride and the second monomer including a bifunctional amine are sequentially supplied to the wafer W which is heated at the temperature necessary for imidization and the supply cycle is repeated a predetermined number of times. Since the polyimide film 1 is formed by copolymerization, the reaction does not proceed if both the monomers do not exist. For example, when one of the monomers is supplied, the other monomer on the wafer W is consumed and the film formation is saturated. Accordingly, the film forming amount depends on the number of the supply cycles. Thus, since non-uniformity of the film formation due to the gas flow is reduced and the dependence of the concentration of the monomer on the film forming amount is decreased, the process is easily controlled, and also, the polyimide film 1 having high quality (high polymerization degree and high insulation properties) and uniform film thickness is obtained. Practically, when the polyimide film 1 is formed using the sequence polymerization method of the present disclosure, as compared with the case that the mixture gas is used, it could be seen that the precision in the supply of the monomers can be lowered by about 0 to 30 times and the precision in the heating temperature of the wafer W can be lowered by about 10 times. In addition, although the precision in the supply of the monomer and the precision in the heating temperature of the wafer W are not strictly controlled, the uniformity of the thickness of the polyimide film 1 is improved by about 2% (1 sigma) as compared with the case that the mixture gas is used.

Further, the different kinds of monomers are not allowed to be mixed with each other under the atmosphere, so that the monomers having different vapor pressures can be polymerized with each other. That is, if the mixture gas in which the monomers are mixed together were to be used to form the polyimide film 1, the vapor pressure of the first monomer and the vapor pressure of the second monomer should be same in order to obtain a high polymerization degree for the polyimide film 1. Meanwhile, if the film formation is performed as described above, the adsorption layer 2 is formed once on the wafer W, and then, the reactive layer 3 is formed after the atmosphere is replaced. Thus, the vapor pressure of the first monomer and the vapor pressure of the second monomer should be same. Accordingly, the polyimide film 1 having a high polymerization degree can be formed regardless of the kinds of monomers used.

Furthermore, since the polyimide film 1 is formed by laminating the reactive layers 3, the polyimide film 1 can be formed at an extremely low film forming temperature of about 150 degrees C. to 200 degrees C. as can be seen in the following examples. Accordingly, the aforementioned polyimide film 1 may be applied as an insulation film used in the process of forming the structure using the temporary fixing material 14 which is exfoliated at a low temperature of 220 degrees C. or so. In other words, according to the method of the present disclosure, the polyimide film 1 can be formed even on an device that cannot endure the film forming temperature (the curing temperature, e.g., 300 degrees C. or so) of the polyimide film when the polyimide film is formed using a conventional method.

In addition, when the reactive layer 3 is formed on the wafer W through the dehydration condensation of the monomers, the silicon layer (the surface of the wafer W) is exposed to the underside of the reactive layer 3 (in the initial stage of the film formation), or another reactive layer 3 is previously formed on the underside of the reactive layer 3 (in the middle stage of the film formation). Thus, the dehydration condensation does not occur at a time in the thickness direction of the polyimide film 1 but occurs in the reactive layer 3 of the outermost surface during the film forming processing, so that it is possible to prevent stress from remaining in the wafer W. Also, in the case that the film forming temperature is low, e.g., 150 degrees C., since the reaction of the reactive layer 3 can be allowed to proceed while the replacement gas is being supplied even though non-reaction precursor remains in the reactive layer 3 formed after the second monomer is supplied, the polyimide film 1 having excellent insulation properties can be formed.

Also, since the gas pressure in the reaction tube 32 is set within the range described above when the film forming process is performed, the polyimide film 1 can be formed along the inner wall of the concave portion 10 although the concave portion 10 having a large aspect ratio has been formed. Accordingly, it is possible to obtain the polyimide film 1 having a satisfactory barrier function.

In addition, it is unnecessary to elevate the temperature of the wafer W, during the process, up to a considerably higher temperature than that in the deposition, as compared with a method of vacuum depositing monomers on a wafer W and then elevating the temperature of the wafer W up to the temperature necessary for imidization. Thus, as described above, the polyimide film 1 can be applied as an insulation film in the process using the temporary fixing material 14, which is exfoliated at a low temperature, and the film forming process can be rapidly performed.

<Another Configuration of Apparatus>

Figure 14:
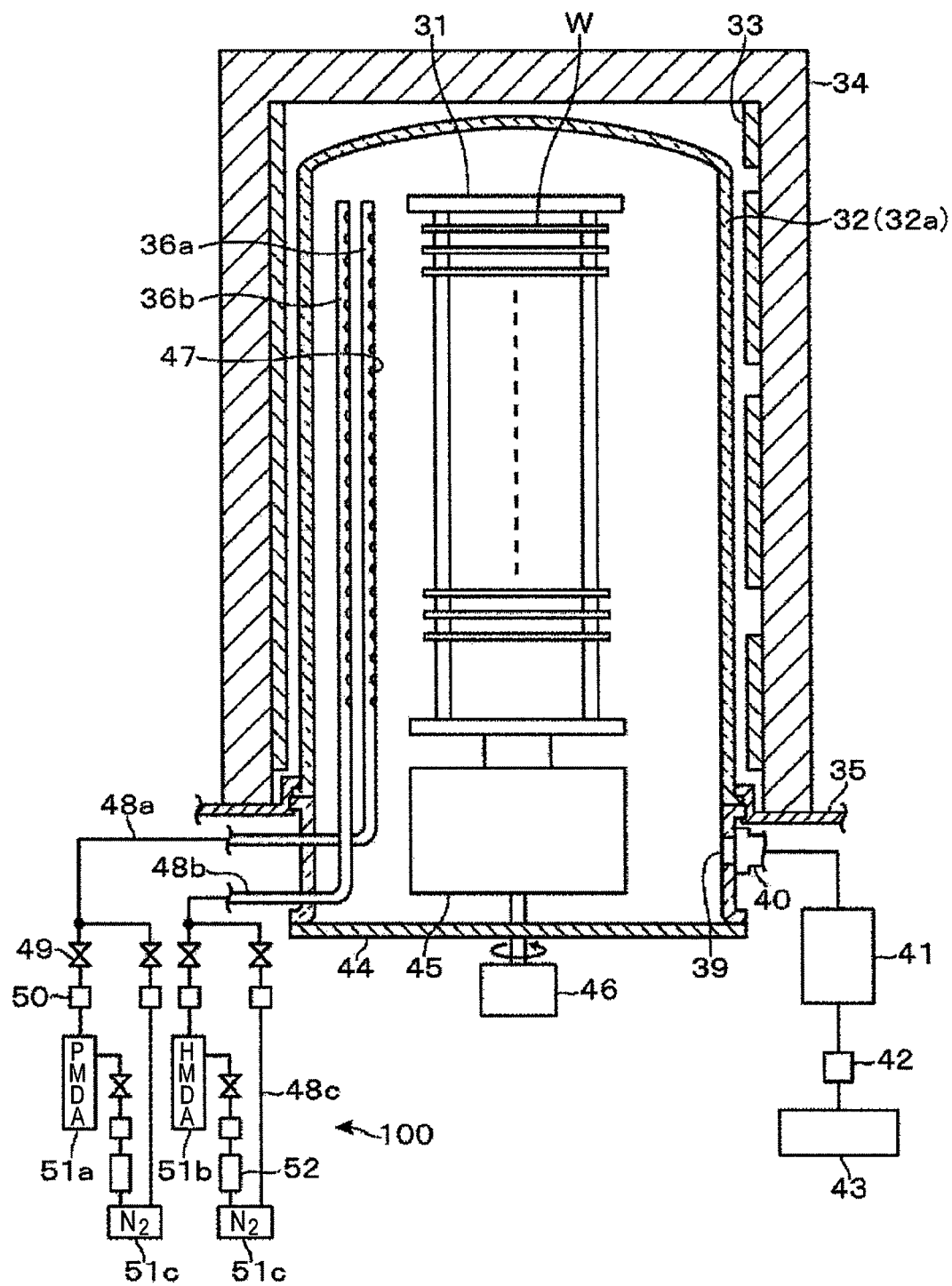
FIG. 14 is a longitudinal sectional view showing another example of the apparatus for performing the film forming method.

Instead of the configuration described in FIG. 4, the configuration shown in FIG. 14 may also be used as the vertical type heat treatment apparatus for forming the polyimide film 1. Specifically, the apparatus is provided with the gas injectors 36a and 36b for the respective monomer. A gas injector 36a for a first processing gas (first monomer) and a gas injector 36b for a second processing gas (second monomer) are transversely arranged adjacent to each other along the outer periphery of the wafer boat 31. The layout of the gas injectors 36a and 36b are schematically shown in FIG. 14. Also, in FIG. 14, the same reference numerals designate the same elements as those of the aforementioned vertical type heat treatment apparatus of FIGS. 4 and 5, and redundant descriptions thereof will be omitted.

Figure 15:
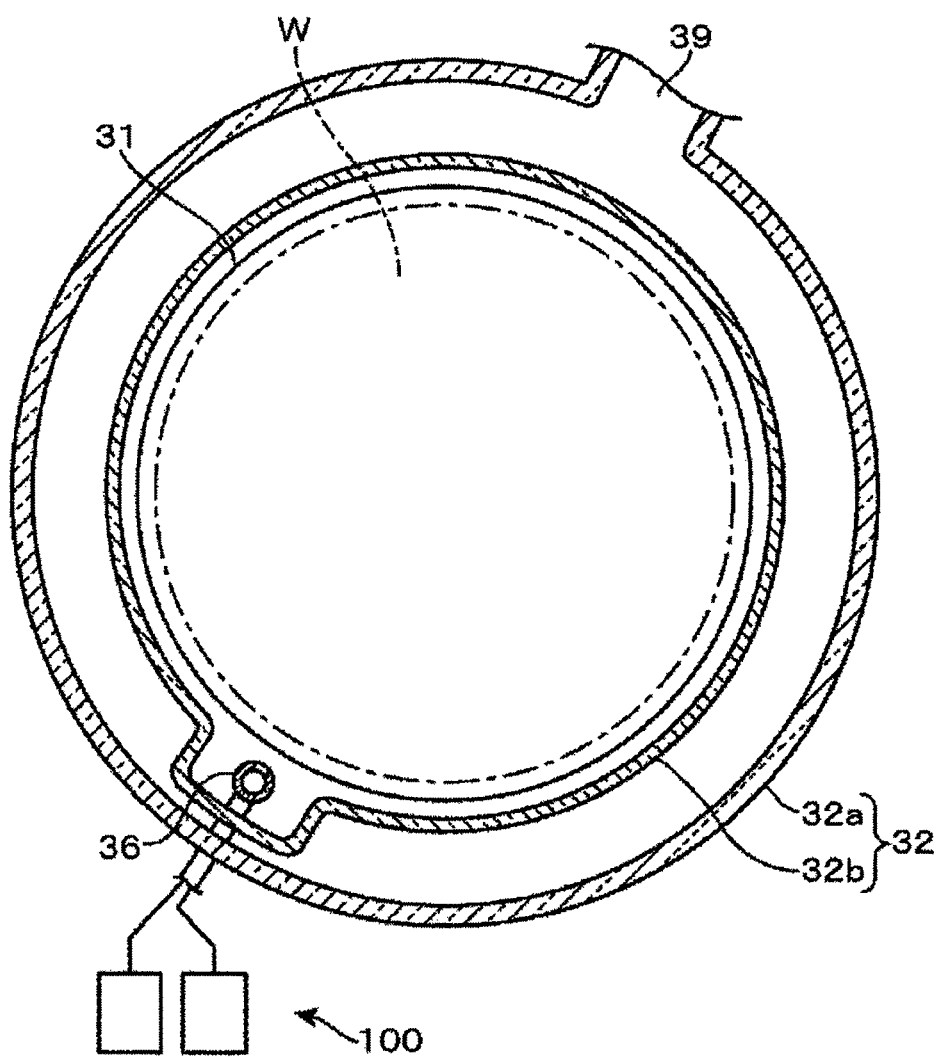
FIG. 15 is a transverse sectional plan view showing the other example of the apparatus for performing the film forming method.

In the aforementioned apparatus shown in FIGS. 4 and 5 and the apparatus of FIG. 14, as shown in FIG. 15, the inner wall of the inner tube 32b (the reaction tube 32) is expanded outward along the lengthwise direction at a portion where the gas injectors 36 (36a and 36b) are disposed, and then, the gas injectors 36 (36a and 36b) may be accommodated in the expanded portion. As such, the gas injectors 36 (36a and 36b) are housed in the inner tube 32b, so that the gas injectors 36 (36a and 36b) can be allowed to approach the wafer W. Also, since it is difficult to allow each processing gas to be removed from the gap region between the outer peripheral end of the wafer boat 31 and the inner tube 32b, the uniformity of the processing can be improved. FIG. 15 shows an example in which the inner tube 32b of FIGS. 4 and 5 is formed to expand outward.

Also, in each apparatus described above, the gas injector 36 is disposed along the lengthwise direction of the wafer boat 31 to supply the processing gas in a side flow method. However, the processing gas may be supplied into the reaction tube 32 from the lower end position of the reaction tube 32 and exhausted through the upper end side of the reaction tube 32.

Figure 16:
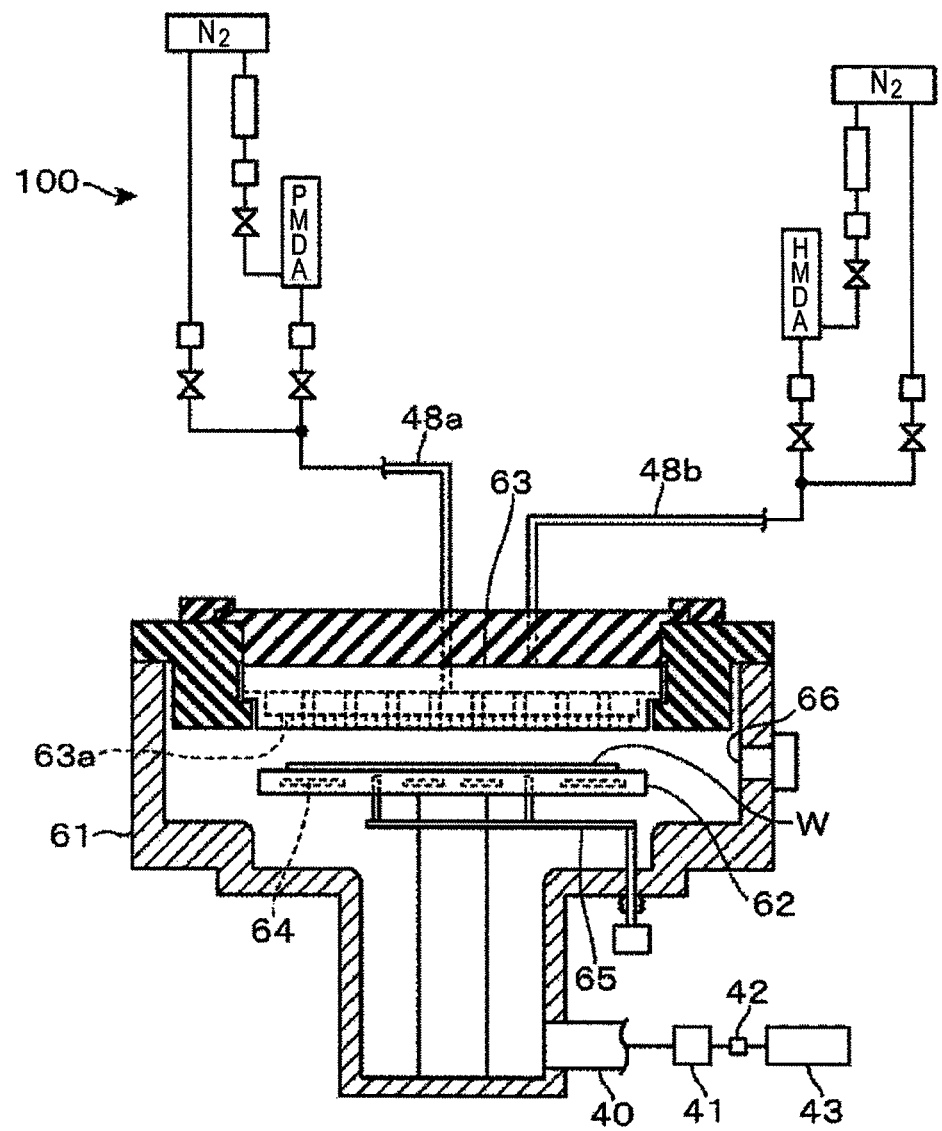
FIG. 16 is a longitudinal sectional view showing still another example of the apparatus for performing the film forming method.

Moreover, FIG. 16 shows a single type apparatus for forming the polyimide film 1. The apparatus is provided with a processing chamber 61 and a susceptor 62 configured to pull and hold a wafer W in the processing chamber 61. A gas shower head 63 is disposed on the ceiling surface of the processing chamber 61 to face the susceptor 62, and gas supply pipes 48a and 48b for supplying first and second processing gases are connected to an upper side of the gas shower head 63, respectively. In addition, a gas flow path 63a is formed inside the gas shower head 63 so that the processing gases are injected into the processing chamber 61 without being mixed together.

In FIG. 16, reference numeral 64 designates a heater embedded in the susceptor 62 to heat the wafer W, and reference numeral 65 designates a lifting pin for lifting the wafer W on the susceptor 62 from below. Also, reference numeral 66 designates a wafer W loading port. In FIG. 16, the same reference numerals designate the same elements as those of the aforementioned apparatus, and redundant descriptions thereof will be omitted. The description on a static chuck installed to the susceptor 62 will also be omitted.

In this apparatus, the first and second processing gases are alternately supplied to the wafer W heated at the temperature at which the polyimide film 1 is formed, and simultaneously, the atmosphere in the processing chamber 61 is replaced by a replacement gas when the processing gases are switched.
<Another Example of Monomer>

Figure 17:
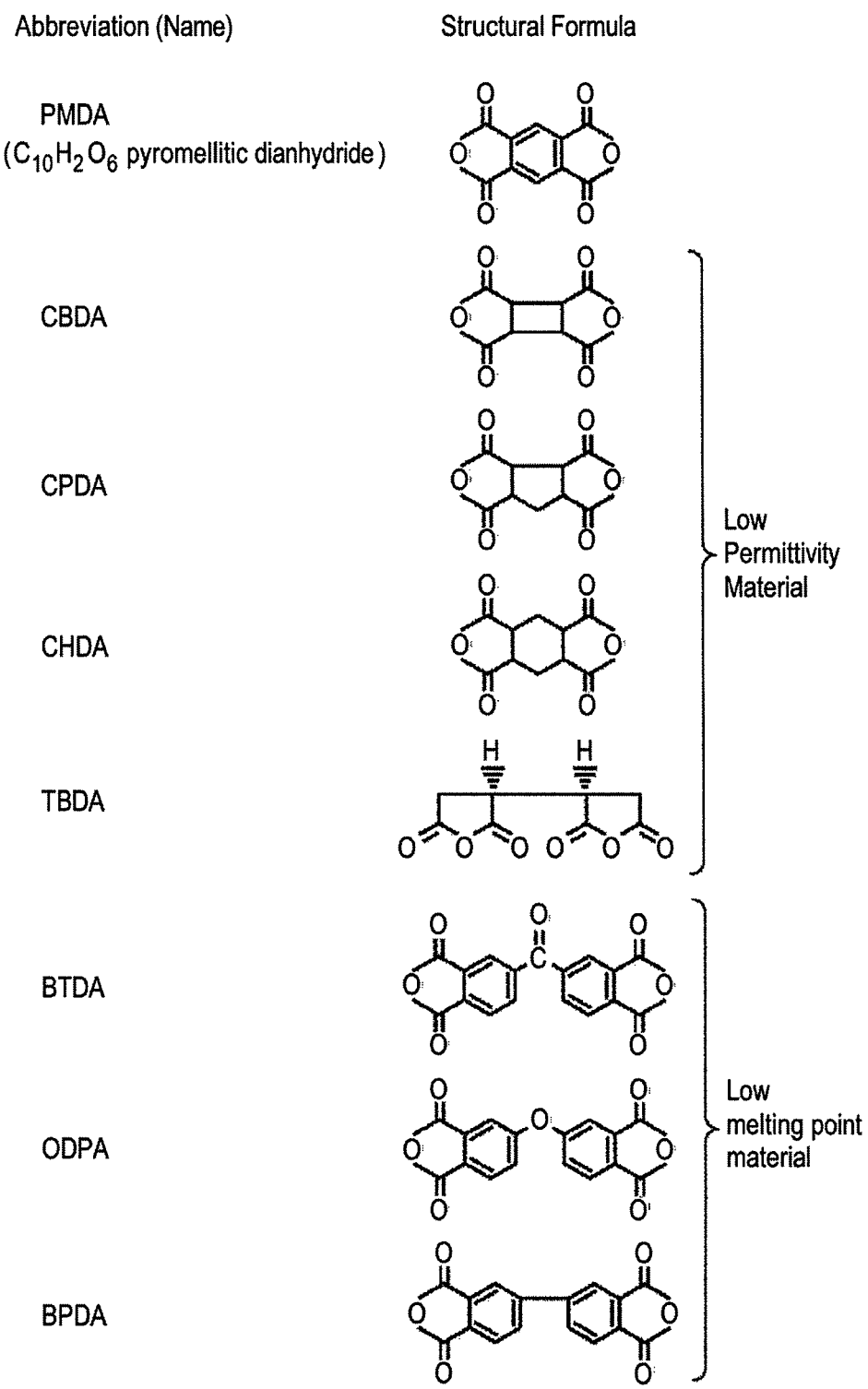
FIG. 17 is an explanatory view showing an example of a first monomer used in the film forming method.

Although PMDA and HMDA are respectively used as examples of the first and second monomers described above, compounds shown in FIGS. 17 and 18 may be respectively used instead of PMDA and HMDA. Specifically, as shown in FIG. 17, the first monomer includes an aromatic monomer containing benzene (PMDA, BTDA, ODPA or BPDA) and a non-aromatic monomer containing no benzene (CBDA, CPDA, CHDA or TBDA), any compound of which has the two aforementioned functional groups, each including the 5-membered ring. The aromatic monomer has a melting point lower than that of the non-aromatic monomer, and the non-aromatic monomer has a relative permittivity lower than that of the aromatic monomer (is superior in insulation properties to the aromatic monomer).

As shown in FIG. 18, the second monomer includes an aromatic monomer (4-4'-ODA, 3-4'-ODA, NDA or DDS) and a non-aromatic monomer (H12MDA, H12MDAMe, H6XDA or DAD), any compound of which has two amino groups formed. In the second monomer, the aromatic monomer has a high thermal resistance, and the non-aromatic monomer has excellent insulation properties.
<Second Embodiment>

As described above, characteristics of the respective first and second monomers vary depending on the types of compounds, and therefore, characteristics of the polyimide film 1 also vary depending on the kinds of monomers used in the synthesis of the polyimide film 1. In the second embodiment, characteristics of at least one of the reactive layers 3 laminated to have a multi-layered structure is different from those of the other reactive layers 3 in order to provide the polyimide film 1 with a plurality of functions (characteristics).

Figure 19:
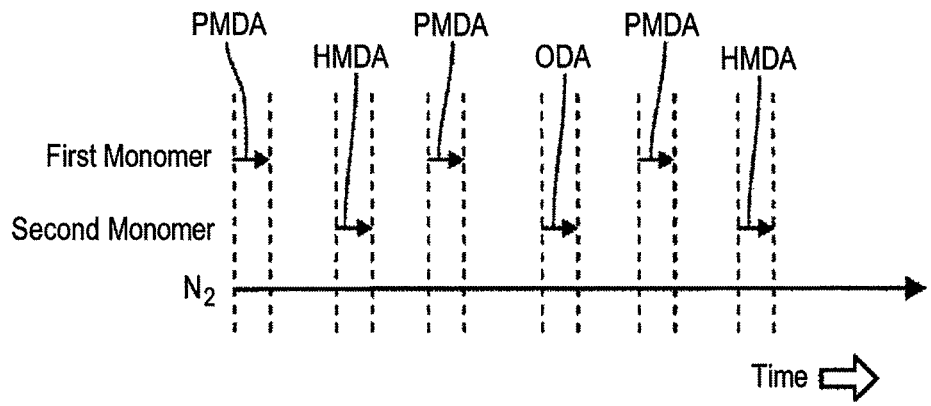
FIG. 19 is a schematic view illustrating another example of the film forming method.
Figure 20:
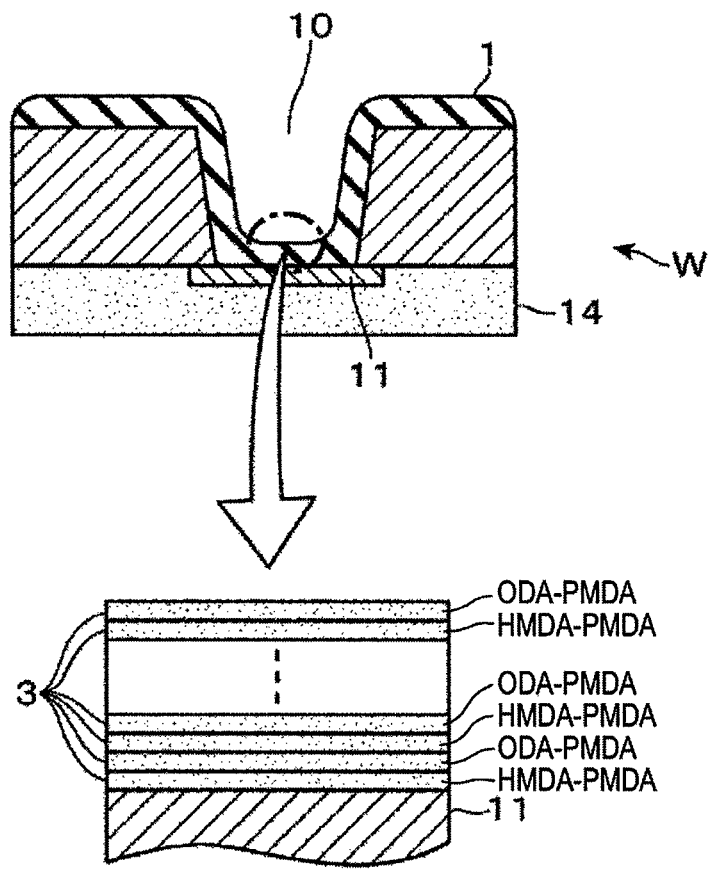
FIG. 20 is a longitudinal sectional view showing an example of a polyimide film formed by the other example of the film forming method.

Specifically, as shown in FIG. 19, among the group of the aforementioned cycles, in each of which the first and second monomers are alternately supplied to the wafer W, a compound used as the second monomer in odd-numbered cycles and a compound used as the second monomer in even-numbered cycles, for example, may be different from each other. That is, HMDA is used as the second monomer in the odd-numbered cycles, while, for example, ODA (4-4'-ODA) is used as the second monomer in the even-numbered cycles. Thus, as shown in FIG. 20, the reactive layer 3 formed from PMDA and HMDA and the reactive layer 3 formed from PMDA and ODA are alternately laminated for a predetermined number of times.

An apparatus for forming the polyimide film using so-called three kinds of monomers may include the same apparatus as the aforementioned apparatus shown in FIG. 4 or 5 except that the gas supply pipe 48b for supplying the second processing gas is divided into two pipes at the upstream side and the two pipes respectively extend to a storage source (not shown) of HMDA and a storage source (not shown) of ODA. As shown in FIG. 14, gas injectors 36a and 36b may be installed for each of the three kinds of monomers, and a single type apparatus may be used. Also, processing conditions including time durations or timings for respectively supplying the first processing gas, the second processing gas and the replacement gas are the same as described above, and therefore, redundant descriptions thereof will be omitted.

In the second embodiment, the following effects are obtained in addition to the effects of the first embodiment. That is, since a benzene is contained in ODA that is an aromatic monomer, a high thermal resistance is obtained in the reactive layer 3 formed from ODA, but satisfactory insulation properties may not be obtained. However, since the reactive layers 3 formed from HMDA containing no benzene are laminated on both upper and lower sides of the reactive layer 3 formed from ODA, the laminated structure described above is employed to obtain satisfactory insulation properties in the film thickness direction. For the reactive layer 3 formed from HMDA, satisfactory insulation properties are obtained in the reactive layer 3, but the reactive layer 3 has a relatively low thermal resistance. However, the reactive layers 3 formed from ODA are disposed on both upper and lower sides of the reactive layer 3 formed from HMDA. Thus, the reactive layer 3 formed from ODA can compensate for thermal resistance, which is deficient in the reactive layer 3 formed from HMDA. Accordingly, two different kinds of second monomers are used as described above, so that it is possible to provide different functions. In this embodiment, the polyimide film 1 with a thermal resistance and high insulation properties can be formed as an insulation film.

In a conventional method of forming a precursor once using a polymerization method (a method using a solution) of the polyimide film 1 or using a mixture gas of monomers and then heating the wafer W, even if three kinds of monomers are tend to be used, it is extremely difficult to make the vapor pressures or mixture proportions of the monomers correspond to each other, and it is further difficult to form the reactive layers 3 from different kinds of monomers at an arbitrary position. Meanwhile, in the present disclosure, the sequence polymerization method is used, in which the first and second monomers are alternately supplied while the atmosphere is replaced when the monomers are switched. Thus, as described in the second embodiment, the polyimide film 1 having a plurality of characteristics can be easily formed, and the position of each reactive layer 3 can be arbitrarily set.

Figure 21:
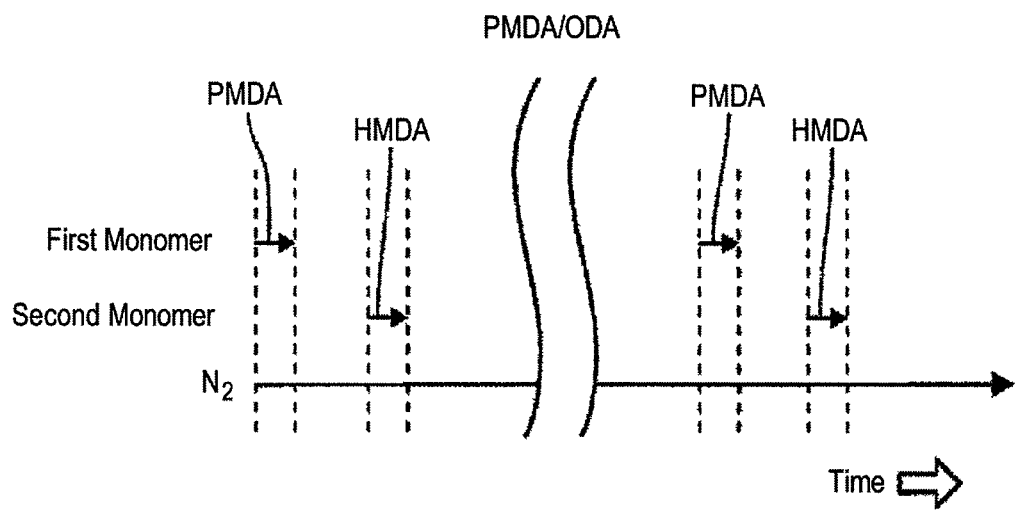
FIG. 21 is a schematic view illustrating another example of the film forming method.
Figure 22:
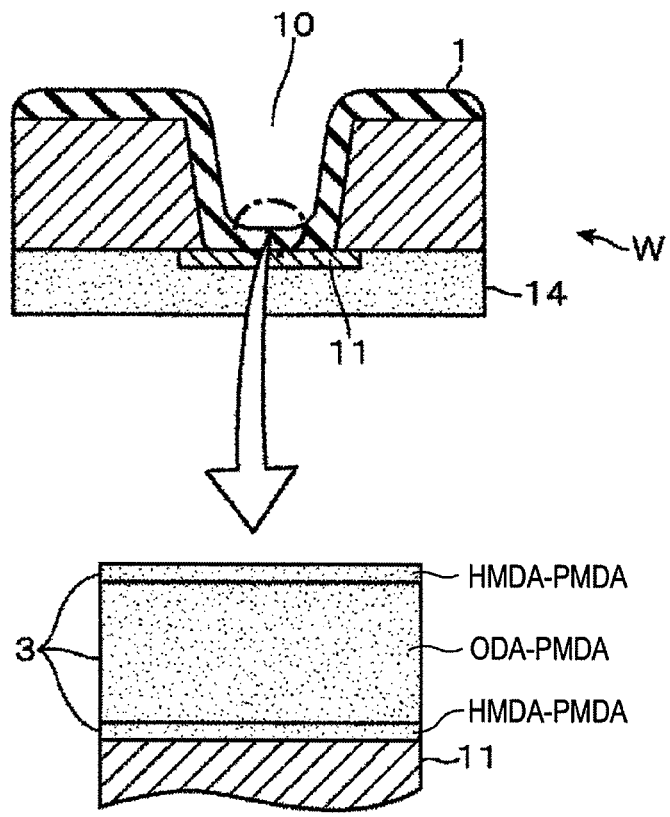
FIG. 22 is a longitudinal sectional view showing an example of a polyimide film formed by the other example of the film forming method.

Since the polyimide film 1 described above functions as a barrier film between the conducting portion 13 buried in the concave portion 10 and the wafer W, it is sufficient that the insulation properties in the film thickness direction should be ensured. Therefore, in order to form the polyimide film 1 having an excellent thermal resistance as well as insulation properties, as shown in FIG. 21, HMDA may be used as the second monomer in at least one of the first cycle and the last cycle in the group of the cycles, in each of which the first and second monomers are supplied. In such a case, as shown in FIG. 22, at least one of the lowermost and uppermost layers in the reactive layers 3 plurally laminated is formed to contain HMDA, thereby obtaining high insulation properties, while intermediate layers between the lowermost and uppermost layers are formed to contain ODA, thereby obtaining a satisfactory thermal resistance. In FIG. 22, depiction of upper and lower boundaries of a plurality of the reactive layers 3 containing ODA is omitted.

Alternatively, at least one of the lowermost and uppermost layers of the polyimide film 1 may be configured to have the reactive layer 3 containing ODA while the reactive layers 3 formed from HMDA may be interposed between the lowermost and uppermost layers. In this case, the thermal resistance can be secured on the at least one of the lowermost and uppermost layers, and the insulation properties can be obtained in the reactive layer 3 containing HMDA.

In the second embodiment described above, different kinds of monomers are used as the second monomer. However, any one kind of monomer may be used as the second monomer, while different kinds of monomers may be used as the first monomer in one cycle and another cycle. In this case, the polyimide film 1 having a plurality of characteristics is also obtained according to the characteristics of the monomers used. Also, the polyimide film 1 may be formed from so-called four kinds of monomers, using different kinds of monomers as the respective first and second monomers in one cycle and another cycle. Also, five or more kinds of monomers may be used. Specifically, three kinds of monomers may be used as the first monomer, while two kinds of monomers may be used as the second monomer. In the case that four or more kinds of monomers are used, a monomer having fluorine (F) bonded thereto is used as one of the monomers, so that the polyimide film 1 may have photosensitivity in addition to thermal resistance and insulation properties.

If the time duration tp for which the replacement gas is supplied when the processing gases are switched is too short, it is apprehended that the replacement of atmosphere may be insufficiently performed, and if the time duration tp is too long, the throughput is decreased. Therefore, the time duration tp is preferably 2 seconds to 10 seconds. Also, if the time durations t1 and t2 for which the respective processing gases are supplied are too short, the processing (the thickness of the polyimide layer 1) may be non-uniform, and if the time durations t1 and t2 are too long, it is difficult to replace the atmosphere due to an excessive increase in the remaining amount of the processing gas. Thus, each of the time durations t1 and t2 is preferably 2 seconds to 5 seconds.

EXAMPLES

Experimental Example 1

Figure 23:
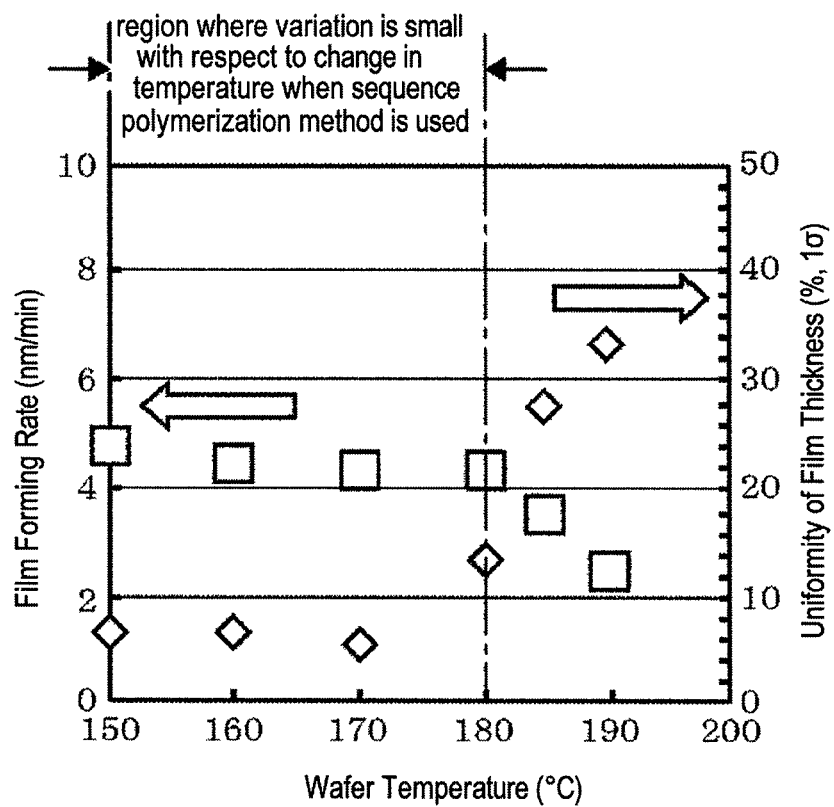
FIG. 23 is a view showing characteristics obtained in examples.
Figure 24:
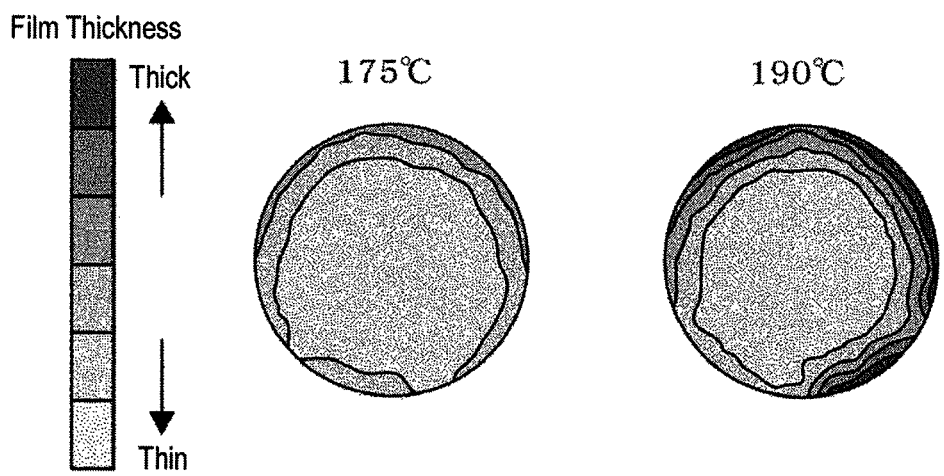
FIG. 24 is a view showing characteristics obtained in examples.

Subsequently, experiments performed on the present disclosure will be described. First, the correlation of film forming temperature (wafer temperature) with a film forming rate and uniformity of film thickness when the polyimide film 1 is formed by the sequence polymerization method will be described. In specific experiments, the film forming temperature was changed from 150 degrees C. to 200 degrees C. at a pitch of 10 degrees C., and simultaneously, the film forming rate and the uniformity of film thickness of the polyimide film 1 formed at each film forming temperature were measured. As a result, it could be seen that the polyimide film 1 can be formed by the sequence polymerization method in the temperature range from 150 degrees C. to 200 degrees C. as shown in FIG. 23. FIG. 24 shows thickness distributions of polyimide films 1 respectively obtained at 175 degrees C. and 190 degrees C.

In this case, it could be seen that the temperature dependence becomes flat for any one of the film forming rate and the uniformity of film thickness at 180 degrees C. or less, and the polyimide film 1 is satisfactorily formed even at a low temperature of 150 degrees C. Meanwhile, above 180 degrees C., both the film forming rate and the uniformity of film thickness were deteriorated. It is considered that such occurrence happens because if the film forming temperature exceeds 180 degrees C., the saturation of the film formation of the monomer adsorbed once on the wafer W is no longer maintained. Therefore, in the sequence polymerization method, the temperature at which the polyimide film 1 is satisfactorily obtained may be 150 degrees C. to 180 degrees C., and the temperature at which the polyimide film 1 can be formed may be 150 degrees C. to 200 degrees C.

Here, in a conventional method of forming a film through a solution (a method of applying monomers at room temperature and then elevating temperature up to a curing temperature necessary for imidization of the monomers), a high temperature of 300 degrees C. or more was required as the curing temperature. Also, even in a deposition polymerization method of mixing first and second monomers in a gaseous phase and supplying the mixture gas to a heated wafer W, the film forming temperature was still 200 degrees C. or more. Further, if the film forming temperature is set lower than 200 degrees C. in the deposition polymerization method, the formation ratio of polyimide (weight of polyimide produced÷weight of polyimide input) is rapidly declined. For example, the formation ratio is declined to 40% or so at 160 degrees C. Meanwhile, since the film formation is possible at a low temperature of 200 degrees C. or less in the sequence polymerization method of the present disclosure, it can be seen that the polyimide film 1 can be applied as an insulation film in a process of stacking a plurality of wafers W using the temporary fixing material 14 which is exfoliated at a low temperature of 220 degrees C. or less as described above. In this case, although the film forming temperature is 150 degrees C. in the sequence polymerization method, the formation ratio is 90% or more. Further, the monomer corresponding to only one layer is saturated in the wafer W, so that molecules can be easily moved in the surface of the wafer W.

Experimental Example 2

Subsequently, a film forming processing was performed by variously changing the film forming temperature from 150 degrees C. to 170 degrees C. and respectively setting the time duration tp for which the replacement gas was supplied to 3 seconds, 6 seconds and 10 seconds for each film forming temperature, and then, film forming rate, coatability, stress, leakage current, chemical resistance and TDS (Thermal Desorption Spectroscopy) were measured. Each of the time durations t1 and t2 for supplying the respective processing gases was set to 2 seconds in each condition. The "coatability" represents a ratio obtained by dividing the thickness of the polyimide film 1 at the lower side of the concave portion 10 by the thickness of the polyimide film at the upper side of the concave portion 10. As such ratio increases, it can be said that the film can be satisfactorily formed in the concave portion 10. Then, the amount of moisture contained in the polyimide film 1 after the film formation was measured in the TDS. The "chemical resistance" represents a variation in film thickness (((film thickness after film formation−film thickness after exposure to chemicals)÷(film thickness after film formation))×100(%)) between before and after the wafer W is exposed to a plurality of chemicals after the polyimide film 1 is formed. That is, while the precursor is dissolved by the chemicals, the polyimide film 1 is not dissolved (or hardly dissolved) by the chemicals. Thus, a proceeding degree of imidization and a resistance against chemicals can be seen by evaluating the variation in the film thickness.

Figure 25:
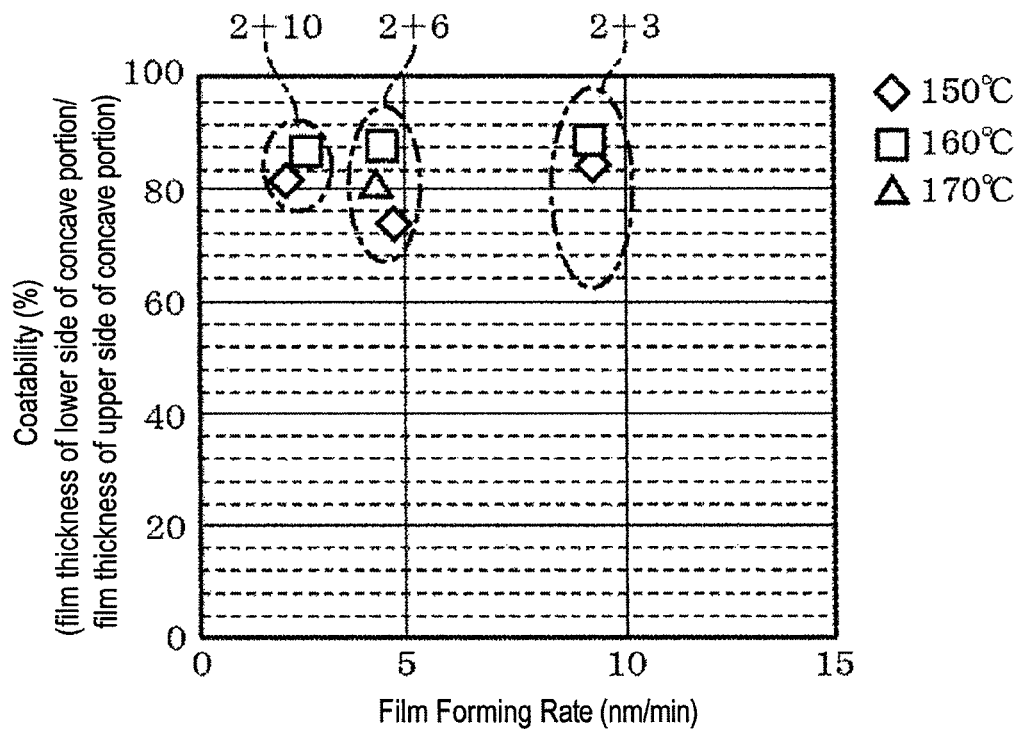
FIG. 25 is a view showing characteristics obtained in examples.

First, referring to FIG. 25 showing the correlation between film forming rate and coatability, as described above, an extremely high coatability of 70% or more was obtained under any condition. The correlation between the film forming rate or film forming temperature and the coatability was not specially shown. That is, even though the time duration tp for supplying the replacement gas was shortened (3 seconds) or lengthened (10 seconds) or the film forming temperature was changed in a range from 150 degrees C. to 170 degrees C., the influence thereof on the coatability was not verified. Also, in FIG. 25, the results obtained under the conditions of the same time duration tp are surrounded by a dash-and-dot line, and "time duration t1 (t2)+time duration tp" is indicated therewith.

Figure 26:
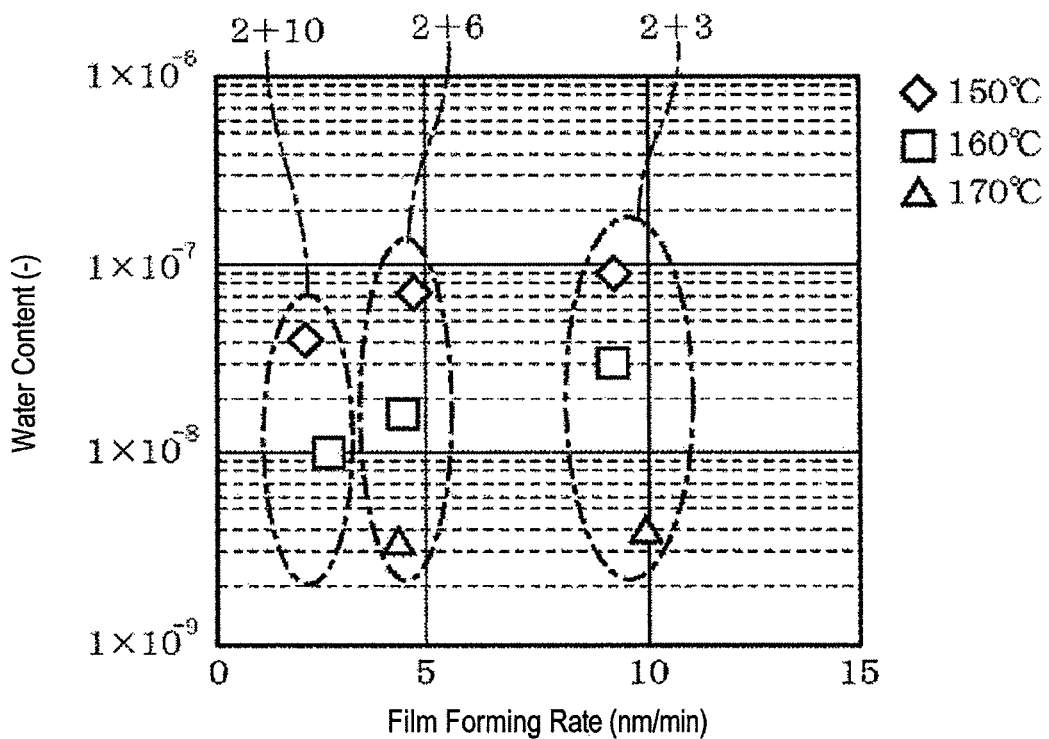
FIG. 26 is a view showing characteristics obtained in examples.

Next, referring to FIG. 26 showing the correlation between film forming rate and results of TDS (water content and purity of the polyimide film 1), the amount of water (the amount of precursor or monomers before dehydration condensation) contained in the polyimide film 1 was extremely small when the film forming temperature was 160 degrees C. or more and the time duration tp was set to 10 seconds at 150 degrees C., and the results thereof became satisfactory as the film forming temperature increased. Thus, it could be seen that as the film forming temperature increased in this temperature range, the polymerization of the polyimide film 1 was easily performed. As the time duration tp for supplying the replacement gas increased, the water content was slightly improved. This is because, as described in FIG. 27 below, not only the replacement of atmosphere is simply performed when the replacement gas is supplied, but also the polyimide film 1 is formed from precursor when the precursor still remains on the wafer W.

Figure 27:
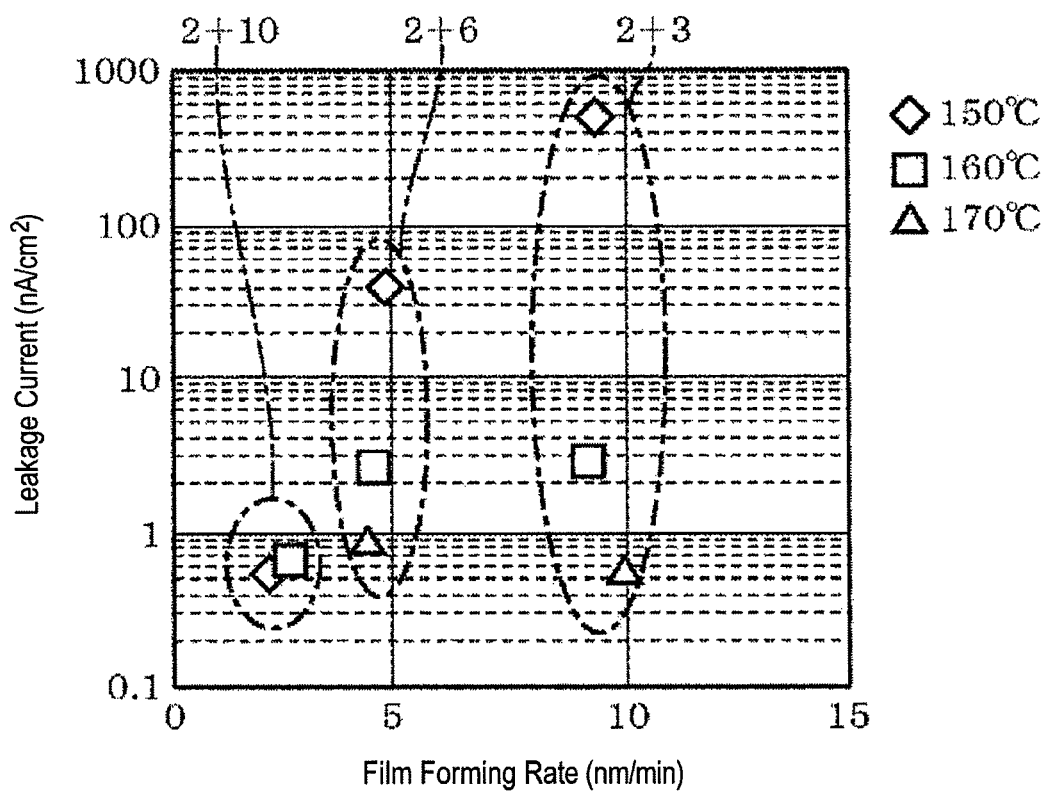
FIG. 27 is a view showing characteristics obtained in examples.

Subsequently, the correlation between the film forming rate and the leakage current will be described with reference to FIG. 27. First, when the supply time duration tp was 3 seconds, the leakage current became satisfactory as the film forming temperature increased. When the supply time duration tp was 6 seconds, the leakage current had the same result as when the supply time duration tp was 3 seconds at the film forming temperature of 170 degrees C. However, at the film forming temperature of 150 degrees C. or 160 degrees C., the leakage current had a result more satisfactory than that when the supply time duration tp was 3 seconds. Therefore, it is considered that when the film forming temperature is 170 degrees C., the formation of the polyimide film 1 has been completed even though the supply time duration tp is 3 seconds. Meanwhile, it is considered that when the film forming temperature is 150 degrees C. or 160 degrees C., the formation of the polyimide film 1 is not completed at the supply time duration tp of 3 seconds, and the precursor remains. Also, the result when the film forming temperature was 150 degrees C. or 160 degrees C. was further improved when the supply time duration tp was lengthened up to 10 seconds, and had about the same result as that when the film forming temperature was 170 degrees C.

From the results described above, when the film forming temperature is 170 degrees C., the reaction from the precursor to the reactive layer 3 is rapidly performed during the supply of the second monomer or during the replacement of the atmosphere thereafter. Thus, even though the supply time duration tp is short, the moisture hardly remains in the polyimide film 1. Meanwhile, if the film forming temperature is decreased, it is difficult to perform the reaction only for the time duration t2 for which the second monomer is supplied and the supply time duration tp for which the atmosphere is replaced. In other words, when the film forming temperature is 170 degrees C., the time required to complete the formation of the reactive layer 3 (hereinafter, referred to as "reaction time duration") is shorter than 5 seconds (2 seconds (time duration t2)+3 seconds (supply time duration tp)). Thus, when the film forming temperature is 170 degrees C., the leakage current of the polyimide film 1 is hardly influenced even though the supply time duration tp is short such as 3 seconds. However, as the film forming temperature is decreased, the reaction time duration becomes longer than 5 seconds. Therefore, in order to obtain a satisfactory (low) leakage current value, it is preferred that the time duration tp for supplying the replacement gas be lengthened by the value obtained by lengthening the reaction time duration.

Referring to Table 1 summarizing the results described above, since the stress remaining in the polyimide film could be released, a satisfactory value was obtained under any condition. In the chemical resistance test, a change in film thickness was satisfactory at the film forming temperature of 160 degrees C. or more. In addition, when the film forming temperature was 150 degrees C., the change in film thickness had a value greater than the result at the temperature of 160 degrees C. However, as the time duration tp was lengthened, the change in film thickness became satisfactory.

TABLE 1

| Film Forming Temp. (° C.) | Time Durations t1, t2 (sec) | Time Duration tp (sec) | Film Forming Rate (nm/min) | Coatability (film thickness of lower side of concave/film thickness of upper side of concave) % | Stress (Pa) | Leakage Current (nA/cm$^2$(at 1 MV/cm)) | Change in Film Thickness of Chemical Resistance Test (%) | H$_2$O Peak in TDS (peak strength at 200° C.) |
|---|---|---|---|---|---|---|---|---|
| 180 | 2 | 6 | 4.8 | 84 | 54 | 0.82 | | 2.0 × 10$^{-9}$ |
| 170 | 2 | 3 | 10 | 60 | 22 | 0.6 | <1 | 4.0 × 10$^{-9}$ |

TABLE 1-continued

| Film Forming Temp. (° C.) | Time Durations t1, t2 (sec) | Time Duration tp (sec) | Film Forming Rate (nm/min) | Coatability (film thickness of lower side of concave/film thickness of upper side of concave) % | Stress (Pa) | Leakage Current (nA/cm$^2$(at 1 MV/cm)) | Change in Film Thickness of Chemical Resistance Test (%) | $H_2O$ Peak in TDS (peak strength at 200° C.) |
|---|---|---|---|---|---|---|---|---|
| | 2 | 6 | 4.3 | 81 | 46 | 0.87 | <1 | $3.6 \times 10^{-9}$ |
| | 2 | 10 | 2.4 | | | | | |
| 160 | 2 | 3 | 9.2 | 86 | | 2.83 | >1 | $3.0 \times 10^{-8}$ |
| | 2 | 6 | 4.4 | 87 | | 2.53 | <1 | $1.6 \times 10^{-8}$ |
| | 2 | 10 | 2.3 | 86 | 27 | 0.62 | <1 | $1.0 \times 10^{-8}$ |
| 150 | 2 | 3 | 9.3 | 84 | | 499 | >20 | $9.0 \times 10^{-8}$ |
| | 2 | 6 | 4.7 | 73 | 20 | 37 | >10 | $7.0 \times 10^{-8}$ |
| | 2 | 10 | 2.2 | 81 | 22 | 0.52 | >3 | $4.0 \times 10^{-8}$ |

Experimental Example 3

In Experimental Example 3, the uniformity of the thickness of the polyimide film 1 was evaluated when the supply time duration tp was set to 1 second, 3 seconds, 6 seconds and 10 seconds, wherein the film forming processing was performed under the following experimental conditions. Similarly, the case that film forming processing was performed using a mixture gas of monomers was evaluated as a comparative example.
(Film Forming Conditions)
Monomer: PMDA, HMDA
Supply amount of each processing gas: 10 sccm
Supply amount of purge gas: 100 sccm
Heating temperature of wafer W: 150 degrees C.
Processing pressure: 26.67 Pa (0.2 torr)
Time duration t1, t2: 2 seconds for each
Gas supply method: Side flow method
Number of cycles: 100

Figure 28:
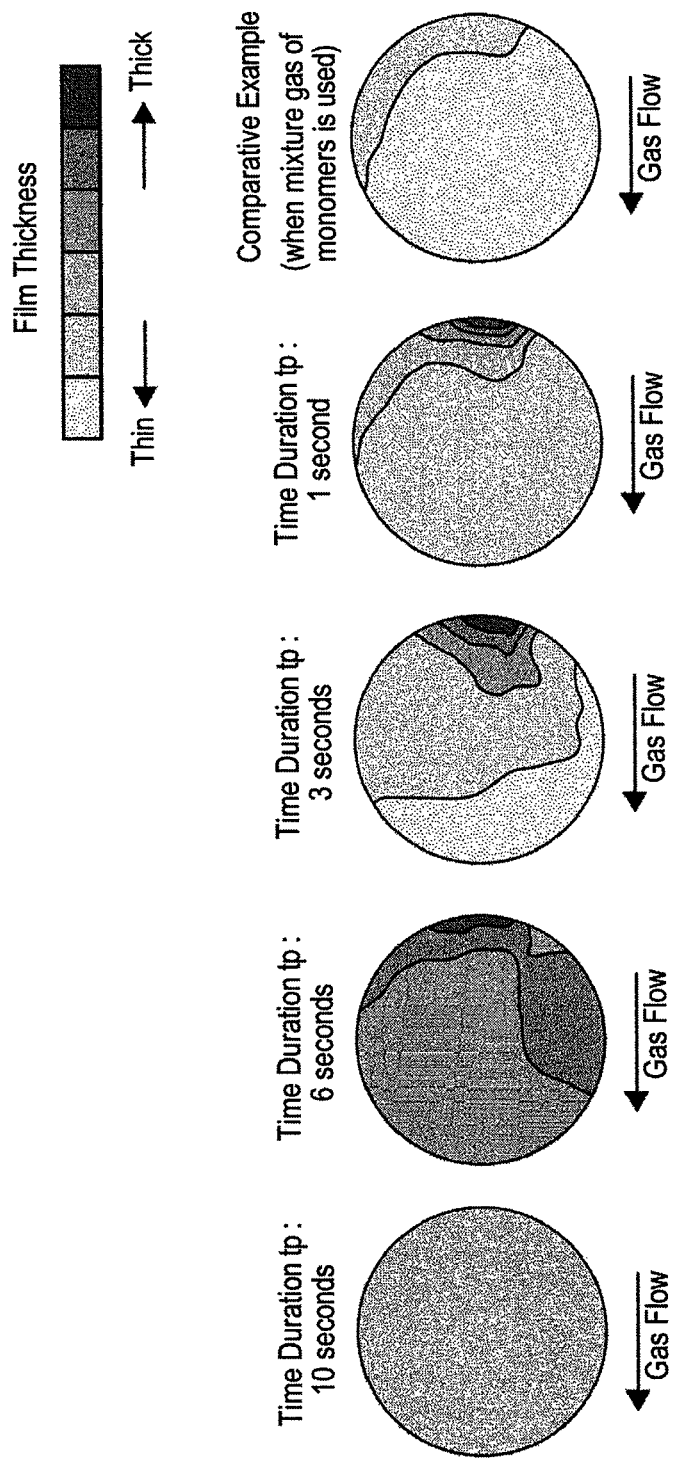
FIG. 28 is a view showing characteristics obtained in examples.

As a result, as shown in FIG. 28 and Table 2, in the comparative example, the gas was rapidly consumed at the upstream side (right side) of the gas flow, and therefore a thick film of 300 nm or more in thickness was formed. On the other hand, the monomer is hardly supplied at the downstream side (left side) of the gas flow, and therefore an extremely thin film of 2 nm in thickness was formed.

TABLE 2

| | Supply Time Duration tp (sec) | 10 | 6 | 3 | 1 | Comparative Example |
|---|---|---|---|---|---|---|
| Film Thickness | Average (nm) | 121 | 181 | 348 | 265 | 44 |
| | Maximum (nm) | 144 | 238 | 671 | 655 | 311 |
| | Minimum (nm) | 114 | 155 | 195 | 143 | 2 |
| | Uniformity (1σ, %) | 5.9 | 9.5 | 29.5 | 41.6 | 166.2 |
| Film Forming Rate | (nm/min) | 3 | 6.8 | 20.9 | 26.5 | 8.9 |
| | (nm/cycle) | 1.2 | 1.8 | 3.5 | 2.6 | 44.3 |

On the other hand, in the sequence polymerization method of the present disclosure, it could be seen that the polyimide film 1 having high uniformity of film thickness is formed under any conditions. As the supply time duration tp was lengthened, i.e., as the amount of the processing gas contained in the atmosphere was decreased, the uniformity of film thickness was improved. Also, in FIG. 28, the region where the film thickness is small is enlarged relative to the other result regions (by narrowing a range of the film thickness) since the uniformity of film thickness is extremely high when the supply time duration tp is 6 seconds and 10 seconds.

Experimental Example 4

Figure 29:
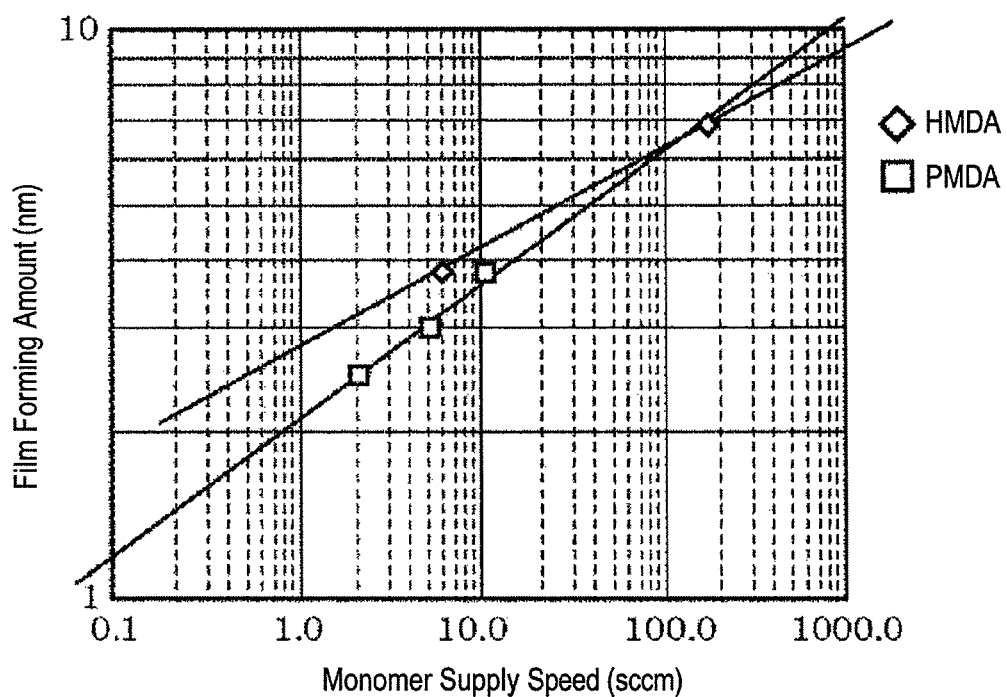
FIG. 29 is a view showing characteristics obtained in examples.

Subsequently, the correlation between supply amount (supply rate) of each monomer and the film forming rate calculated based on the film forming amount (film thickness) shown in FIG. 29 was verified. As shown in Tables 3 and 4, it could be seen that the film forming rate has the almost same value regardless of the supply amount of each monomer. Specifically, when the supply amount of each monomer was increased from 10 sccm to 15 sccm, the increase rate of the supply amount was 150%, but the increase rate of the film forming rate stayed at 7.1% or 11%. Thus, in the sequence polymerization method, since the adsorption of the first monomer onto the surface of the wafer W is saturated, the thickness of the adsorption layer 2 is almost constant in each cycle. Also, it can be seen that since the reactive layer 3 is formed up to the thickness of the adsorption layer 2, the thickness of the reactive layer 3 is almost constant in each cycle. In other words, it can be seen that the supply amount of the monomer do not need to be controlled so high in the sequence polymerization method. In the sequence polymerization method of the present disclosure, the change in the film forming rate with respect to the supply amount of gas becomes about 1/10 as compared with when the film forming processing is performed using the mixture gas of the monomers. Also, when the supply amount of one of the two monomers is changed, the supply amount of the other monomer is fixed to a certain value.

TABLE 3

| Supply Amount of HMDA (sccm) | Film Forming Rate (nm/min) |
|---|---|
| 10 | 4.2 |
| 15 | 4.5 |
| Δ % = 150% | Δ % = 7.1 |

TABLE 4

| Supply Amount of PMDA (sccm) | Film Forming Rate (nm/min) |
|---|---|
| 10 | 3.7 |
| 15 | 4.1 |
| Δ % = 150% | Δ % = 11 |

Experimental Example 5

In the sequence polymerization method of the present disclosure, it was verified that the heating temperature (the film forming temperature) of the wafer W had influence on the thickness of the polyimide film 1. The heating temperature of the wafer W was set to 140 degrees C., 150 degrees C. and 160 degrees C., and simultaneously, the other film forming conditions were set as follows.

Figure 30:
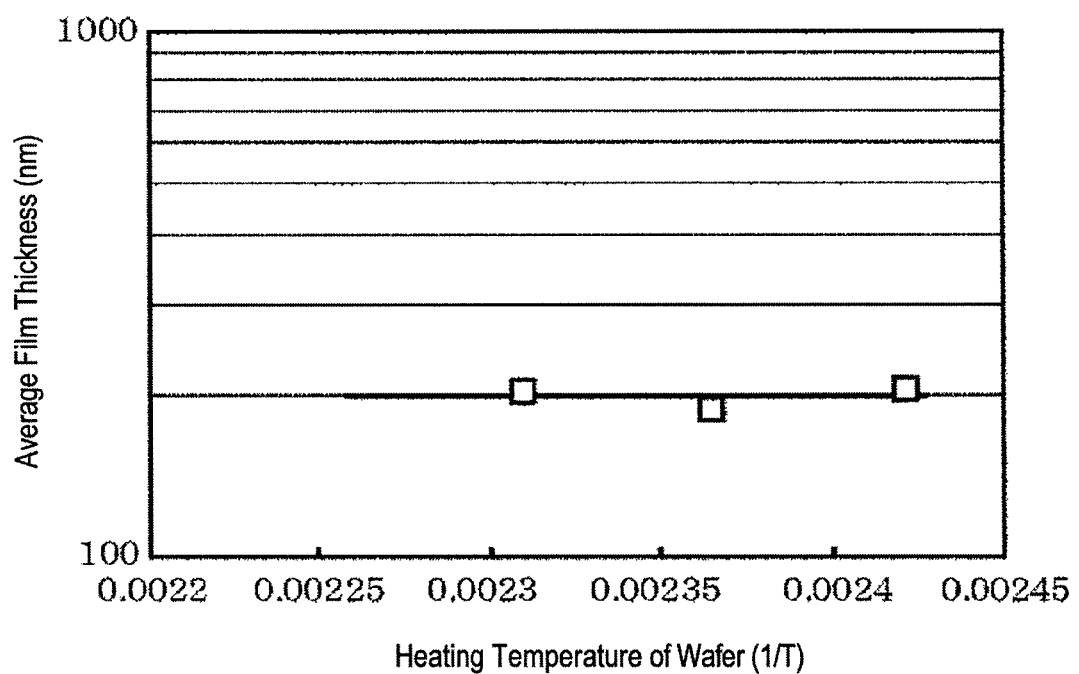
FIG. 30 is a view showing characteristics obtained in examples.
Figure 31:
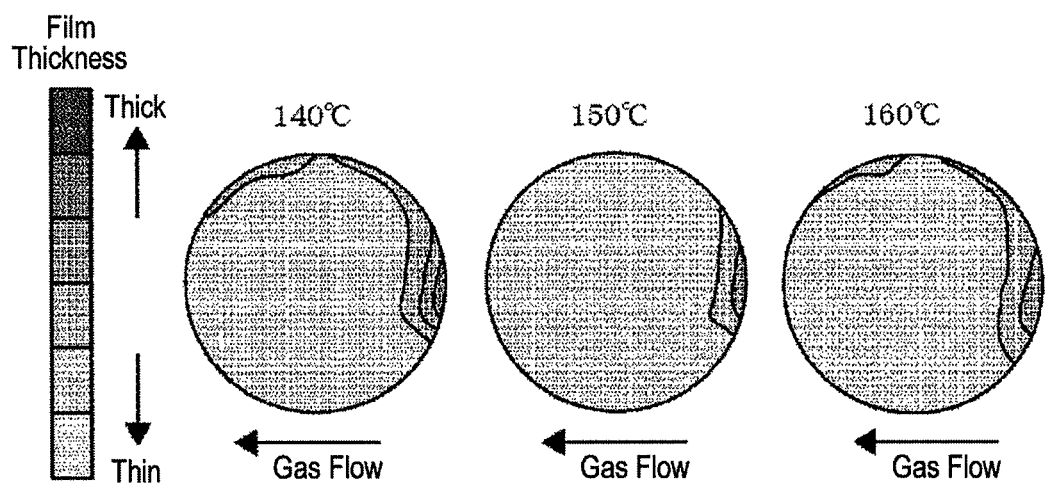
FIG. 31 is a view showing characteristics obtained in examples.

(Film Forming Conditions)
Monomer: PMDA, HMDA
Supply amount of each processing gas: 10 sccm
Supply amount of nitrogen gas (carrier gas and replacement gas): 100 sccm
Time duration t1, t2: 2 seconds for each
Supply time duration tp: 3 seconds
Gas supply method: Side flow method As a result, as shown in FIG. 30, the average thickness of the polyimide film 1 was almost constant regardless of the heating temperature of the wafer W. The distributions of film thickness and measurement results obtained from the experiment are shown in FIG. 31 and Table 5, respectively. In FIG. 30, the horizontal axis represents a reciprocal number of temperature T.

TABLE 5

|  |  | Film Forming Temperature (° C.) | | |
| --- | --- | --- | --- | --- |
|  |  | 140 | 150 | 160 |
| Film Thickness | Average (nm) | 207 | 187 | 203 |
|  | Maximum (nm) | 363 | 324 | 330 |
|  | Minimum (nm) | 148 | 136 | 154 |
|  | Uniformity (1σ, %) | 20.2 | 19.7 | 18.4 |
| Film Forming Rate | (nm/min) | 12.4 | 11.2 | 12.2 |
|  | (nm/cycle) | 2.1 | 1.9 | 2 |

Also, when comparing the present disclosure with the comparative example, a degree of change in film thickness was evaluated with respect to a variation in the heating temperature of the wafer W. Specifically, since the polyimide film was formed by causing the kinds of monomers or processing conditions to correspond to each other, as shown in Table 6, in the present disclosure, the variation in film thickness was extremely small with respect to the variation in the heating temperature of the wafer W. Meanwhile, in the comparative example using a mixture gas (premix), the variation in film thickness was increased with respect to the variation in the heating temperature of the wafer W. Thus, in the sequence polymerization method of the present disclosure, the polyimide film 1 having high uniformity can be formed without strictly controlling the heating temperature of the wafer W, as compared with the comparative example. Accordingly, for example, the configuration of the apparatus can be simplified.

TABLE 6

| Film Forming Method | Second Monomer | Result |
| --- | --- | --- |
| Premix | HMDA | X |
| Sequence Polymerization Method | HMDA | ○ |

According to the present disclosure, a polyimide film is formed by sequentially supplying a substrate heated at the temperature necessary for imidization with a first monomer including a bifunctional acid anhydride and a second monomer including a bifunctional amine and then performing such a supply cycle a predetermined number of times. When one of the monomers is supplied, the other monomer on the substrate is consumed and the film formation is saturated. Accordingly, the film forming amount depends on the number of the supply cycles. Thus, since non-uniformity of the film formation due to the gas flow is reduced and the dependence of the concentration of the monomers on the film forming amount is decreased, it is possible to easily control the process and to obtain a high-quality polyimide film. Further, it is unnecessary to elevate the temperature of the substrate up to a temperature considerably higher than the deposition temperature during the process, as compared with a convention method of vacuum depositing monomers on a substrate and then increasing the temperature of the substrate up to a temperature necessary for imidizing the monomers. Accordingly, it is possible to apply the polyimide film even to a device that cannot endure a high temperature, to rapidly perform the film forming processing, and to perform satisfactory burial into a concave portion of the substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a polyimide film on a surface of a substrate by dehydration condensation of a first monomer having a bifunctional acid anhydride and a second monomer having a bifunctional amine, the method comprising:
    loading the substrate into a processing chamber;
    heating the substrate to a temperature at which the polyimide film is formed;
    performing a predetermined number of cycles, wherein each cycle from the predetermined number of cycles comprises supplying a first processing gas containing the first monomer to the substrate, supplying a second processing gas containing the second monomer to the substrate, and supplying a replacement gas in the processing chamber between supplying the first processing gas and supplying the second processing gas thereby replacing atmosphere in the processing chamber by the replacement gas; and
    evacuating the first and/or the second processing gas out of the processing chamber,
    wherein at least one of the first and second monomers used in one cycle of the predetermined number of cycles is different from at least one of the first and second monomers used in another cycle of the predetermined number of cycles.

2. The method of claim 1, wherein an aromatic monomer and a non-aromatic monomer are used as the at least one of the first and second monomers in the one cycle and the another cycle, respectively.

3. The method of claim 1, wherein the one cycle and the another cycle are alternately performed.

4. The method of claim 1, wherein the another cycle is performed in at least one of the first cycle and the last cycle of the predetermined number of cycles.

* * * * *